(12) United States Patent
Lin et al.

(10) Patent No.: US 9,570,319 B2
(45) Date of Patent: Feb. 14, 2017

(54) METHOD OF MANUFACTURING A SEMICONDUCTOR DEVICE

(71) Applicant: Taiwan Semiconductor Manufacturing Company, Ltd., Hsin-Chu (TW)

(72) Inventors: Yu Chao Lin, Hsin-Chu (TW); Ming-Ching Chang, Hsin-Chu (TW); Chao-Cheng Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 31 days.

(21) Appl. No.: 14/292,048

(22) Filed: May 30, 2014

(65) Prior Publication Data

US 2015/0348845 A1    Dec. 3, 2015

(51) Int. Cl.
| | |
|---|---|
| *H01L 21/8234* | (2006.01) |
| *H01L 21/321* | (2006.01) |
| *H01L 21/3105* | (2006.01) |
| *H01L 29/66* | (2006.01) |
| *H01L 21/311* | (2006.01) |
| *H01L 21/84* | (2006.01) |
| *H01L 21/8238* | (2006.01) |
| *H01L 21/02* | (2006.01) |
| *H01L 21/3213* | (2006.01) |

(52) U.S. Cl.
CPC ... *H01L 21/32115* (2013.01); *H01L 21/31053* (2013.01); *H01L 21/31116* (2013.01); *H01L 21/823821* (2013.01); *H01L 21/845* (2013.01); *H01L 29/66545* (2013.01); *H01L 29/66795* (2013.01); *H01L 21/0206* (2013.01); *H01L 21/32136* (2013.01); *H01L 21/823857* (2013.01)

(58) Field of Classification Search
None
See application file for complete search history.

(56) References Cited

U.S. PATENT DOCUMENTS

| | | | | |
|---|---|---|---|---|
| 8,507,979 | B1* | 8/2013 | Huang | H01L 29/66477 257/330 |
| 8,552,505 | B1* | 10/2013 | Kim et al. | 257/369 |
| 2004/0048424 | A1* | 3/2004 | Wu | H01L 21/84 438/154 |
| 2005/0164479 | A1* | 7/2005 | Perng | H01L 21/28194 438/591 |
| 2008/0185637 | A1* | 8/2008 | Nagaoka | H01L 29/66545 257/327 |
| 2009/0096001 | A1* | 4/2009 | Ludwig | H01L 28/91 257/303 |
| 2011/0298017 | A1* | 12/2011 | Jain et al. | 257/288 |
| 2012/0139061 | A1* | 6/2012 | Ramachandran | H01L 21/76895 257/410 |

(Continued)

*Primary Examiner* — Michael Lebentritt
*Assistant Examiner* — Jordan Klein
(74) *Attorney, Agent, or Firm* — Slater Matsil, LLP

(57) ABSTRACT

Semiconductor devices and methods of manufacture thereof are disclosed. In some embodiments, a method of manufacturing a semiconductor device includes: providing a workpiece having a recess and a dielectric layer lining the recess; forming a conductive structure within the recess, wherein the conductive structure partially fills the recess; and recessing the dielectric layer, wherein, after the recessing, a top surface of the recessed dielectric layer is disposed within the recess.

20 Claims, 18 Drawing Sheets

(56) References Cited

U.S. PATENT DOCUMENTS

| | | | |
|---|---|---|---|
| 2013/0065023 A1* | 3/2013 | Ali et al. | 428/172 |
| 2013/0295758 A1* | 11/2013 | Kim | H01L 21/823885 |
| | | | 438/589 |
| 2014/0004693 A1* | 1/2014 | Hoon | H01L 21/28079 |
| | | | 438/589 |
| 2014/0077274 A1* | 3/2014 | Xie et al. | 257/288 |
| 2014/0273386 A1* | 9/2014 | Tsao et al. | 438/301 |

* cited by examiner

600 

Continuation of drawing sheet 12 of 18

Recessing the dielectric layer, wherein, after the recessing, the recessed dielectric layer lines a lower portion of the sidewalls of the first insulating layer and the exposed portion of the substrate — 612

Forming a second insulating layer over the gate electrode and over the recessed dielectric layer, wherein the second insulating layer covers a top surface of the recessed dielectric layer and the top surface of the gate electrode — 614

Figure 6 (Continued)

METHOD OF MANUFACTURING A SEMICONDUCTOR DEVICE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a FinFET, which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
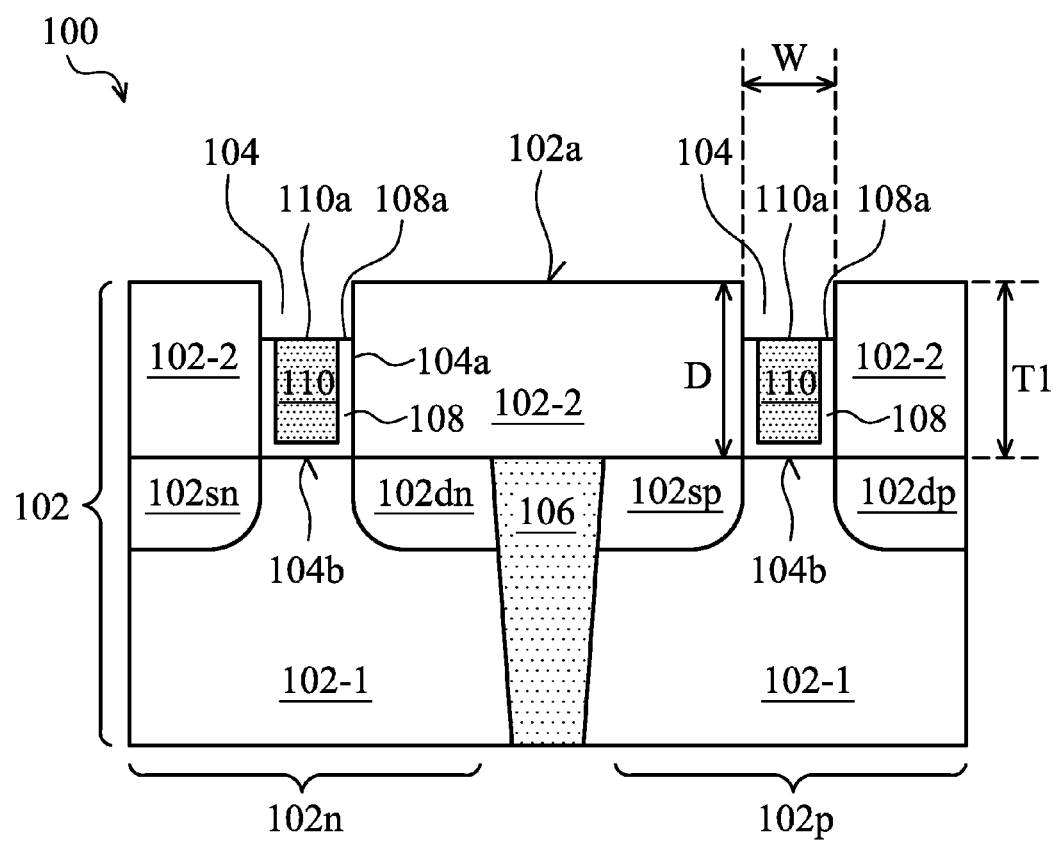
FIG. 1A and FIG. 1B show cross-sectional views of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a cross-sectional view of a semiconductor device 100 in accordance with some embodiments.

The semiconductor device 100 may be a device in an intermediate stage of manufacture. As an example, the semiconductor device 100 may be a planar transistor in an intermediate stage of manufacture.

The semiconductor device 100 (e.g. planar transistor) may include a workpiece 102 having a recess 104. Only two recesses 104 are shown in the drawings; however, the workpiece 102 may include only one recess or more than two recesses (e.g. three, four, five, or more recesses) in accordance with some embodiments.

The workpiece 102 may include a substrate 102-1 and a first insulating layer 102-2 disposed over the substrate 102-1. The workpiece 102 has a top surface 102a, which may include, or may be, a top surface of the first insulating layer 102-2, as shown in FIG. 1A.

The recess 104 may be formed in the first insulating layer 102-2 of the workpiece 102, as shown in the example of FIG. 1A. The recess 104 may be disposed at the top surface 102a of the workpiece. For example, a mouth of the recess 104 may be disposed at the top surface 102a of the workpiece 102.

The recess 104 may include at least one sidewall 104a and a bottom surface 104b. In one or more embodiments, the recess 104 may extend into the workpiece 102 from the top surface 102a of the workpiece 102. For example, in an embodiment, the recess 104 may extend partially through the first insulating layer 102-2. However, in another embodiment, as in the example shown in FIG. 1A, the recess 104 may fully extend through the first insulating layer 102-2, e.g. to expose the underlying substrate 102-1.

As described above, the recess 104 may be formed in the first insulating layer 102-2 of the workpiece 102. Accordingly, the sidewall 104a of the recess 104 may include, or may be, a sidewall of the first insulating layer 102-2, as shown in the example of FIG. 1A. As described above, the recess 104 may fully extend through the first insulating layer 102-2, thus exposing the portion of a top surface of the substrate 102-1. In such an embodiment, the bottom surface 104b of the recess 104 may include, or may be, the top surface of the substrate 102-1 of the workpiece 102, as shown in the example of FIG. 1A.

A depth D of the recess 104 may, for example, be measured from the mouth of the recess to the bottom surface 104b of the recess 104. In an embodiment where the recess 104 extends partially through the first insulating layer 102-2, the depth D of the recess 104 may be less than a thickness T1 of the first insulating layer 102-2 of the workpiece 102. However, in another embodiment where the recess 104 extends fully through the first insulating layer 102-2, the depth D of the recess 104 may be substantially equal to the thickness T1 of the first insulating layer 102-2 of the workpiece 102, as shown in FIG. 1A.

In an embodiment, the depth D of the recess 104 may be in the range from about 50 nm to about 130 nm, for example in the range from about 60 nm to about 120 nm, for example about 75 nm, although other values may be possible as well in accordance with other embodiments.

In accordance with an embodiment, as in the example shown in FIG. 1A, the sidewall 104a of the recess 104 may be substantially straight. However, in another embodiment, the recess 104 may have angled or tapered sidewalls.

In accordance with an embodiment, a width W of the recess 104 may be measured as the widest lateral extent of the recess 104. For example, the width W may be measured as the lateral extent of the recess 104 at the top surface 102a of the workpiece 102, as shown in the example of FIG. 1A. By way of another example, the width W may be measured as the lateral extent of the mouth of the recess 104, which may be disposed at the top surface 102a of the workpiece 102.

In one or more embodiments, the width W of the recess 204 may be in the range from about 50 nm to about 100 nm, although other values may be possible as well in accordance with other embodiments.

The substrate 102-1 of the workpiece 102 may include, or may be, a semiconductor substrate. The semiconductor substrate may include, or may be, a silicon substrate. Alternatively, the substrate 102-1 may include, or may consist of, another elementary semiconductor material (such as germanium); a compound semiconductor material (including silicon carbide, gallium arsenic, gallium phosphide, indium phosphide, indium arsenide, and/or indium antimonide); an alloy semiconductor material (including SiGe, GaAsP, AlInAs, AlGaAs, GaInAs, GaInP, and/or GaInAsP); or combinations thereof.

In an embodiment, the substrate 102-1 of the workpiece 102 may include, or may be, a semiconductor on insulator (SOI) substrate. The SOI substrate may include a buried oxide (BOX) layer formed by a process such as separation by implanted oxygen (SIMOX), and/or other suitable processes. Further, the substrate 102-1 may include an epitaxial layer (epi-layer) that may, for example, be strained for performance enhancement.

The first insulating layer 102-2 of the workpiece 102 may include, or may consist of, a dielectric material that may be formed during manufacture of the semiconductor device 100. As an example, the first insulating layer 102-2 may be an interlayer dielectric (ILD) layer of the semiconductor device 100.

The first insulating layer 102-2 (e.g. ILD layer) may include one or more layers (e.g., one or more ILD layers) and may include silicon dioxide, fluorinated silicon glass (FGS), SILK (a product of Dow Chemical of Michigan), BLACK DIAMOND (a product of Applied Materials of Santa Clara, Calif.), and/or other insulating materials.

In some embodiments, as in the example shown in FIG. 1A, the workpiece 102 (e.g. the substrate 102-1 of the workpiece 102) may include an n-channel metal oxide semiconductor (NMOS) region 102n where an NMOS transistor device may be formed. The workpiece 102 (e.g. substrate 102-1 of the workpiece 102) may also include a p-channel metal oxide semiconductor (PMOS) region 102p where a PMOS transistor device may be formed. Only one NMOS region 102n and only one PMOS region 102p are shown in the drawings; however, a plurality of NMOS regions 102n and PMOS regions 102p may be formed across the workpiece 102 (e.g. across the substrate 102-1 of the workpiece 102) in accordance with some embodiments.

The workpiece 102 (e.g. substrate 102-1 of the workpiece 102) may include doped regions. For example, as shown in FIG. 1A, the NMOS region 102n includes a source region 102sn (e.g. transistor source region) and a drain region 102dn (e.g. transistor drain region). In like manner, the PMOS region 102p shown in FIG. 1A includes a source region 102sp (e.g. transistor source region) and a drain region 102dp (e.g. transistor drain region). In the description that follows, reference is made to the source region 102sn and the drain region 102dn in the NMOS region 102n of the workpiece 102. However, it may be noted that similar references may be made to the source region 102sp and the drain region 102dp in the PMOS region 102n of the workpiece 102.

As shown in the example of FIG. 1A, the source region 102sn is disposed adjacent to a sidewall 104a of the recess 104, and the drain region 102dn is disposed adjacent to an opposite sidewall of the recess 104. In other words, the recess 104 may be disposed between the source region 102sn and the drain region 102dn. Stated in yet another way, the source region 102sn and the drain region 102dn may be disposed adjacent to opposite sidewalls of the recess 104.

The workpiece 102 may include an isolation structure 106 disposed between the NMOS region 102n and the PMOS region 102p. As an example, the isolation structure 106 may include, or may be, a shallow trench isolation (STI) region or another suitable type of electrically insulating region that may electrically isolate the NMOS region 102n and the PMOS region 102p from each other.

In the embodiment shown in FIG. 1A, the isolation structure 106 may be formed within the substrate 102-1 of the workpiece. The isolation structure 106 may optionally or additionally be disposed in other regions or portions of the workpiece 102, e.g. in other regions or portions of the substrate 102-1 and/or in other regions or portions of the first insulating layer 102-2.

The semiconductor device 100 may include a dielectric layer 108, which may partially line the recess 104. For example, the bottom surface 104b and a lower portion of the sidewall 104a of the recess 104 may be lined with the dielectric layer 108, while an upper portion of the sidewall 104a of the recess 104 may be free from the dielectric layer 108. Accordingly, a top surface 108a of the dielectric layer 108 may be disposed within the recess 104, as shown in FIG. 1A.

In one or more embodiments, the dielectric layer 108 may be a gate dielectric layer of the semiconductor device 100. The dielectric layer 108 may be a single layer structure (e.g. including one layer of dielectric material) or a multilayer structure (e.g. including two or more layers of dielectric material).

In accordance with some embodiments, the dielectric layer 108 may have a thickness in a range from about 10 angstroms to about 50 angstroms, e.g. in a range from about 10 angstroms to about 30 angstroms or in a range from about 40 angstroms to about 100 angstroms. In some embodiments, the dielectric layer 108 may have a thickness of about 40 angstroms. Other thickness may be possible as well in accordance with other embodiments.

The dielectric layer 108 may include, or may consist of, silicon oxide. Other exemplary materials included in the dielectric layer 108 include silicon nitride, silicon oxynitride, a high dielectric constant (k) material, and/or combinations thereof.

Examples of a high k material that may be included in the dielectric layer 108 include a material having a dielectric constant greater than that of silicon dioxide. For example, a high k material that may be included in the dielectric layer 108 may have a dielectric constant greater than or substantially equal to about 5, for example greater than about 15, for example in the range from about 15 to about 30.

Other examples of a high k material that may be included in the dielectric layer 108 include hafnium silicate, hafnium oxide, hafnium dioxide, zirconium oxide, zirconium silicate, zirconium dioxide, aluminum oxide, tantalum pentoxide, hafnium dioxide-alumina ($Hf_{O2}$-$A_{l2O3}$) alloy, or combinations thereof.

Further examples of a high k material that may be included in the dielectric layer 108 include metal oxides. The metal oxide may be selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

As shown in the example of FIG. 1A, a conductive structure 110 may be disposed within the recess 104. The conductive structure 110 may partially fill the recess 104. In other words, a top surface 110a of the conductive structure 110 may be disposed within the recess 104. Stated in yet another way, the top surface 110a of the conductive structure 110 may be disposed at a level lower than a level of the top surface 102a of the workpiece 102.

In one or more embodiments, the conductive structure 110 may be a gate electrode of the semiconductor device 100. The conductive structure 110 may be a single layer structure (e.g. including only one electrically conductive layer) or a multilayer structure (e.g. including two or more electrically conductive layers). For example, in an embodiment where the conductive structure 110 is a multilayer structure, the conductive structure 110 may include a conductive liner (e.g. a work function metal liner) and a conductive layer (see description below in respect of FIG. 4C to FIG. 4F).

In one or more embodiments, the conductive structure 110 (e.g. gate electrode) has a thickness in the range of about 30 nm to about 60 nm, although other thicknesses may be possible as well in accordance with other embodiments.

In the embodiment shown in FIG. 1A, the top surface 110a of the conductive structure 110 is substantially co-planar with the top surface 108a of the dielectric layer 108. In another embodiment, the top surface 110a of the conductive structure 110 and the top surface 108a of the dielectric layer 108 may be disposed at different levels. However, in all embodiments of the semiconductor device 100, the top surface 110a of the conductive structure 110 and the top surface 108a of the dielectric layer 108 are disposed within the recess 104.

In an embodiment, the conductive structure 110 may include, or may be, a metal conductive structure (e.g. a metal gate electrode). For example, in one or more embodiments, the conductive structure 110 may include, or may consist of, Cu, W, Ti, Ta, Cr, Pt, Ag, Au and/or combinations thereof. By way of another example, the conductive structure 110 may include, or may consist of, suitable metallic compounds like TiN, TaN, NiSi, CoSi and/or combinations thereof. In other embodiments, the conductive structure 110 may include, or may consist of other suitable conductive materials.

Figure 1B:
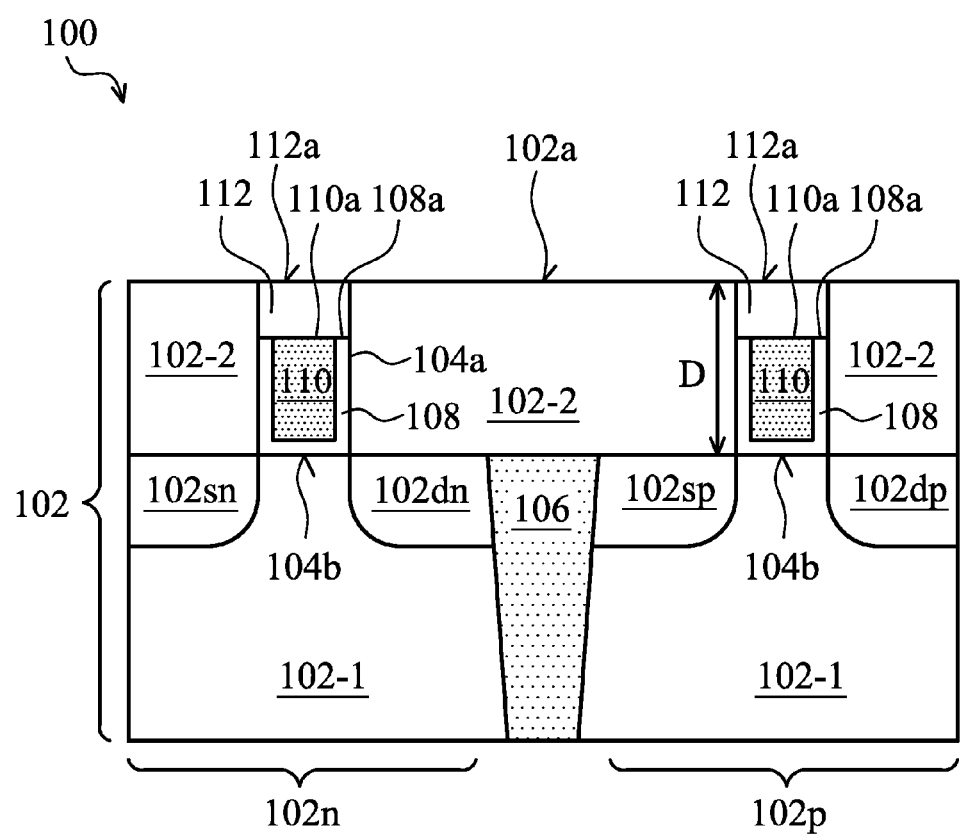

The recess 104 of the semiconductor device 100 (e.g. planar transistor) may subsequently be filled. For example, as shown in FIG. 1B, a second insulating layer 112 may be formed within the recess 104. The second insulating layer 112 may cover the top surface 110a of the conductive structure 110 and the top surface 108a of the dielectric layer 108 since both these structures are disposed within the recess 104 and below the second insulating layer 112.

The second insulating layer 112 may include, or may consist of, at least one of an oxide material, a nitride material, and an oxinitride material. For example, in an embodiment, the second insulating layer 112 may include, or may consist of, a compound including SiN or $Si_3N_4$. By way of another example, in an embodiment, the second insulating layer 112 may include, or may consist of, SiON.

The semiconductor device 100 shown in FIG. 1B may subsequently be subjected to a cleaning process. For example, the top surface 102a of the workpiece 102 and a top surface 112a of the second insulating layer 112 may be subjected to a wet clean process, which may involve use of an acid (e.g. hydrofluoric acid, HF).

As described above, the second insulating layer 112 may cover the top surface 110a of the conductive structure 110 and the top surface 108a of the dielectric layer 108, both of which are disposed within the recess 104 and below the second insulating layer 112. An effect provided by such an arrangement may be that the dielectric layer 108 is protected from the cleaning process (e.g. wet clean process). In other words, the dielectric layer 108 is not exposed to the cleaning process (e.g. wet clean process). Consequently, the dielectric layer 108 is not etched (e.g. partially etched) by the cleaning process (e.g. wet clean process, e.g. with HF), and thus, the integrity of the dielectric layer 108 is preserved. This can reduce resistance drift in the semiconductor device 100. Furthermore, by preserving the integrity of the dielectric layer 108, a cleaning agent (e.g. an etchant) used during the cleaning process (e.g. wet clean process) is prevented from contacting the conductive structure 110 (e.g. gate electrode). Accordingly, loss of material from the conductive structure 110 (e.g. gate electrode) is reduced or prevented, and the integrity of the conductive structure 110 (e.g. gate electrode) is also preserved. As a result, gate loss events in the semiconductor device 100 are reduced or prevented. In summary, by disposing the top surface 110a of the conductive structure 110 and the top surface 108a of the dielectric layer 108 within the recess 104, and by covering these surfaces with the second insulating layer 112, defects in the semiconductor device 100 (e.g. defects in the dielectric layer 108 and/or the conductive structure 110) are reduced or prevented, and this leads to better electrical performance of the semiconductor device 100.

Figure 2A:
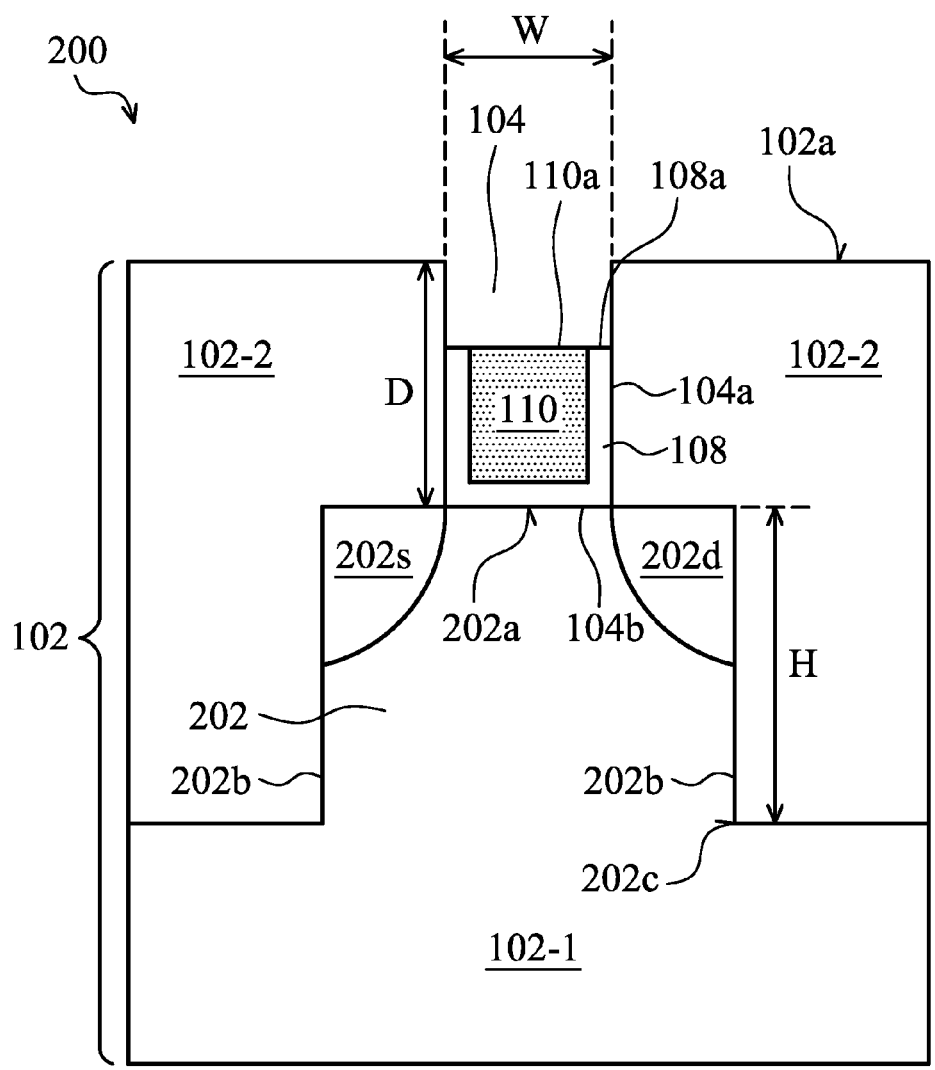
FIG. 2A and FIG. 2B show cross-sectional views of a semiconductor device including a fin, in accordance with some embodiments.

FIG. 2A shows a cross-sectional view of a semiconductor device 200 in accordance with some embodiments.

Reference signs in FIG. 2A that are the same as in FIG. 1A denote the same or similar elements as in FIG. 1A. Thus, those elements will not be described in detail again here; reference is made to the description above. Differences between FIG. 2A and FIG. 1A are described below.

The semiconductor device 200 may be a device in an intermediate stage of manufacture. As an example, the semiconductor device 200 may be a fin field effect transistor (FinFET) in an intermediate stage of manufacture.

As shown in the example of FIG. 2A, the substrate 102-1 of the workpiece 102 may include a fin 202. The fin 202 may have a top surface 202a and a sidewall 202b.

In an embodiment, the fin 202 may be formed by means of etching a portion of the substrate 102-1 of the workpiece 102, although other methods of forming the fin may be possible as well. For example, in another embodiment, the fin 202 may be formed by at least one of epitaxial growth, deposition and lithographic processes.

In an embodiment, the sidewall 202b of the fin 202 may be substantially straight, as shown in the example of FIG. 2A. Alternatively, in another embodiment, the fin 202 may have angled or tapered sidewalls 202b.

The fin 202 may extend from the substrate 102-1 toward the top surface 102a of the workpiece 102 by a predetermined distance. For example, the fin 202 may have a height H, which may be measured from a base 202c of the fin 202 to the top surface 202a of the fin 202 in a vertical direction. The height H may be in a range from about 20 nm to about 50 nm in some embodiments. The height H may be about 30 nm in some embodiments, for example.

The fin 202 may include doped regions, such as a source region 202s (e.g. transistor source region) and a drain region 202d (e.g. transistor drain region). In an embodiment, the source region 202s and the drain region 202d may be formed by means of an epitaxial process, although other processes may be possible as well in accordance with other embodiments.

In an embodiment, the source region 202a and the drain region 202d of the fin 202 may be disposed at or near the top surface 202a of the fin 202. In an embodiment, the source region 202a and the drain region 202d of the fin 202 may further be disposed at or near the sidewall 202b of the fin 202.

The first insulating layer 102-2 may be disposed over the source region 202s and the drain region 202d of the fin 202. The first insulating layer 102-2 may additionally cover the sidewalls 202b of the fin 202, as shown in the example of FIG. 2A. In the embodiment shown in FIG. 2A, the substrate 102-1 may include, or may be, an SOI substrate. In another embodiment, the substrate 102-1 may include, or may be, a bulk substrate, and in such an embodiment, the first insulating layer 102-1 may include an oxide layer proximate to the substrate 102-1 of the workpiece 102.

In the embodiment shown in FIG. 2A, the fin 202 is shown to be in contact with (e.g. direct contact with, e.g. direct physical contact with) the first insulating layer 102-2. However, in another embodiment, there may be at least one intervening layer (e.g. an etch stop layer) disposed between the fin 202 and the first insulating layer 102-2.

The recess 104 may be disposed between the source region 202s and the drain region 202d of the fin 202. In an embodiment, the bottom surface 104b of the recess 104 may be the top surface 202a of the fin 202, as shown in FIG. 2A. The recess 104 may be disposed over what can subsequently be a channel region between the source region 202s and the drain region 202d.

As shown in FIG. 2A, the conductive structure 110 (e.g. gate electrode) may partially fill the recess 104. Furthermore, the bottom surface 104b and a lower portion of the sidewall 104a of the recess 104 may be lined with the dielectric layer 108, while an upper portion of the sidewall 104a of the recess 104 may be free from the dielectric layer 108. Accordingly, the top surface 108a of the dielectric layer 108 may be disposed within the recess 104, as shown in FIG. 2A.

Figure 2B:
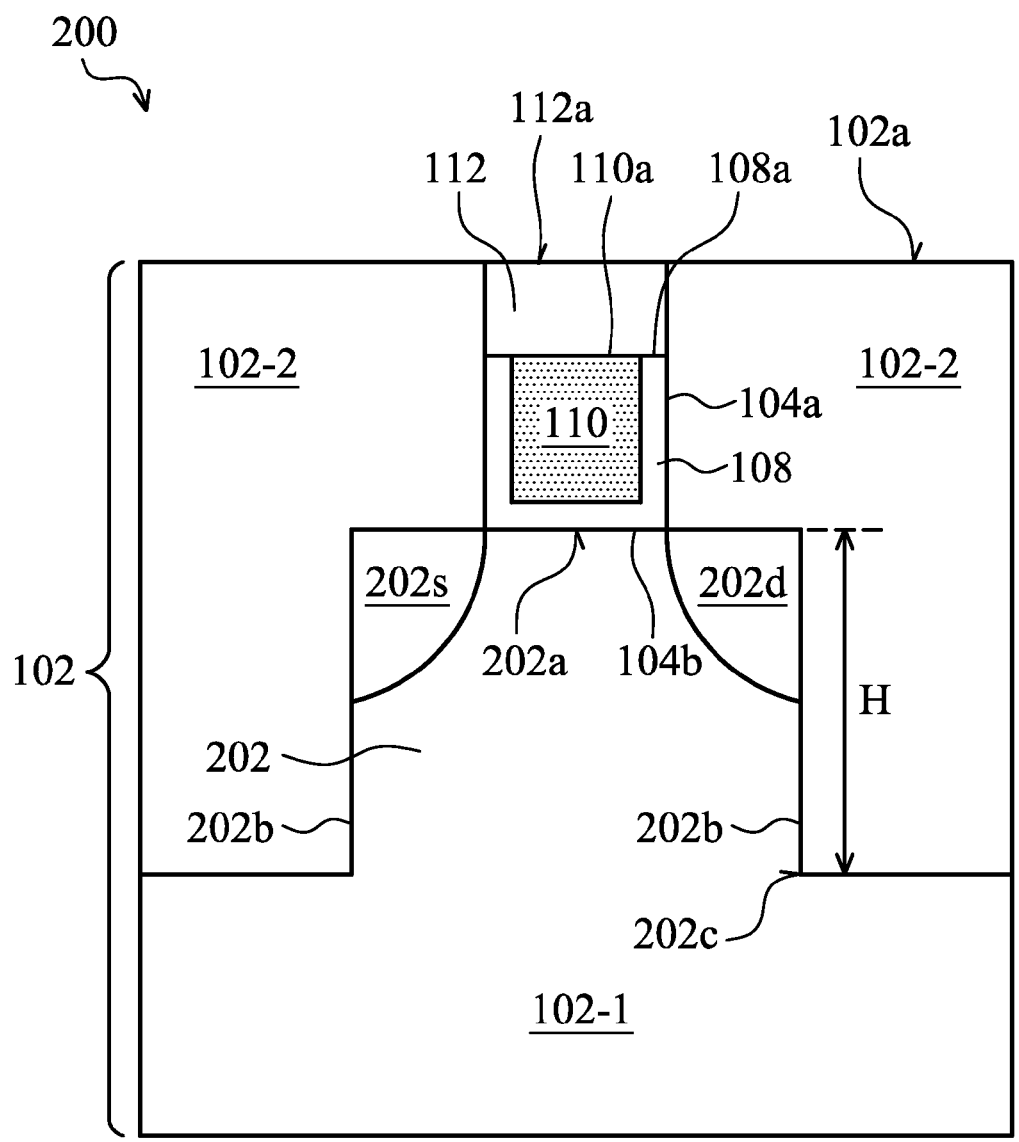

The recess 104 of the semiconductor device 200 (e.g. FinFET) may subsequently be filled. For example, as shown in FIG. 2B, a second insulating layer 112 may be formed within the recess 104. The second insulating layer 112 may cover the top surface 110a of the conductive structure 110 and the top surface 108a of the dielectric layer 108 since both these structures are disposed within the recess 104 and below the second insulating layer 112.

The semiconductor device 200 shown in FIG. 2B may subsequently be subjected to a cleaning process. For example, the top surface 102a of the workpiece 102 and a top surface 112a of the second insulating layer 112 may be subjected to a wet clean process, which may involve use of an acid (e.g. hydrofluoric acid, HF).

As described above, the second insulating layer 112 may cover the top surface 110a of the conductive structure 110 and the top surface 108a of the dielectric layer 108, both of which are disposed within the recess 104 and below the second insulating layer 112. An effect provided by such an arrangement may be that the dielectric layer 108 is protected from the cleaning process (e.g. wet clean process). In other words, the dielectric layer 108 is not exposed to the cleaning process (e.g. wet clean process). Consequently, the dielectric layer 108 is not etched (e.g. partially etched) by the cleaning process (e.g. wet clean process, e.g. with HF), and thus, the integrity of the dielectric layer 108 is preserved. This can reduce resistance drift in the semiconductor device 200. Furthermore, by preserving the integrity of the dielectric layer 108, a cleaning agent (e.g. an etchant) used during the cleaning process (e.g. wet clean process) is prevented from contacting the conductive structure 110 (e.g. gate electrode). Accordingly, loss of material from the conductive structure 110 (e.g. gate electrode) is reduced or prevented, and the integrity of the conductive structure 110 (e.g. gate electrode) is also preserved. As a result, gate loss events in the semiconductor device 200 are reduced or prevented. In summary, by disposing the top surface 110a of the conductive structure 110 and the top surface 108a of the dielectric layer 108 within the recess 104, and by covering these surfaces with the second insulating layer 112, defects in the semiconductor device 200 (e.g. defects in the dielectric layer 108 and/or the conductive structure 110) are reduced or prevented, and this leads to better electrical performance of the semiconductor device 200.

Figure 3:
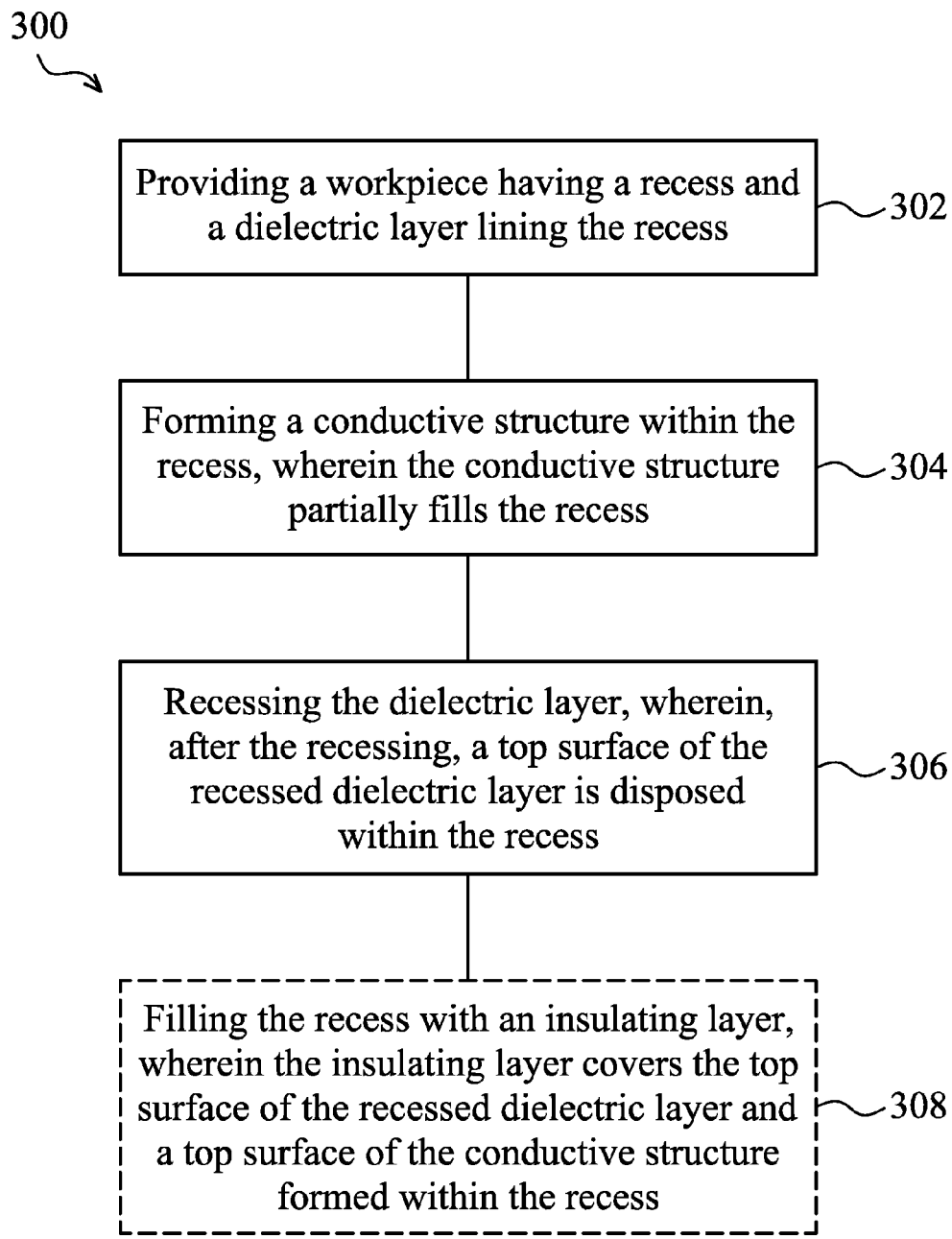
FIG. 3 shows a method of manufacturing a semiconductor device, in accordance with some embodiments.

FIG. 3 shows a method 300 of manufacturing a semiconductor device, in accordance with some embodiments.

The method 300 includes: providing a workpiece having a recess and a dielectric layer lining the recess (in 302); forming a conductive structure within the recess, wherein the conductive structure partially fills the recess (in 304); and recessing the dielectric layer, wherein, after the recessing, a top surface of the recessed dielectric layer is disposed within the recess (in 306).

The method 300 may optionally include: filling the recess with an insulating layer, wherein the insulating layer covers the top surface of the recessed dielectric layer and a top surface of the conductive structure formed within the recess (in 308).

The method 300 may, for example, be used to manufacture the semiconductor device 100 (e.g. planar transistor) shown in FIG. 1A and FIG. 1B and/or the semiconductor device 200 (e.g. FinFET) shown in FIG. 2A and FIG. 2B.

FIG. 4A to FIG. 4I show a process flow illustrating the method 300 of manufacturing a semiconductor device, in accordance with one or more embodiments.

The process flow shown in FIG. 4A to FIG. 4I may, for example, be part of a gate-last process, where a gate electrode is formed after forming source and drain regions in the workpiece 102 (e.g. in the substrate 102-1 of the workpiece 102). The gate-last process may include the use of a dummy gate structure, and the process flow shown in FIG. 4A to FIG. 4I may show the gate-last process after removal of the dummy gate structure.

The description that follows describes the method 300 in the context of manufacturing the semiconductor device 100 (e.g. planar transistor). However, it may be noted that the method 300 may analogously be applied to the manufacture of the semiconductor device 200 (e.g. FinFET).

Reference signs in FIG. 4A to FIG. 4I that are the same as in FIG. 1A and FIG. 1B denote the same or similar elements as in FIG. 1A and FIG. 1B. Thus, those elements will not be described in detail again here; reference is made to the description above for the sake of brevity.

Figure 4A:
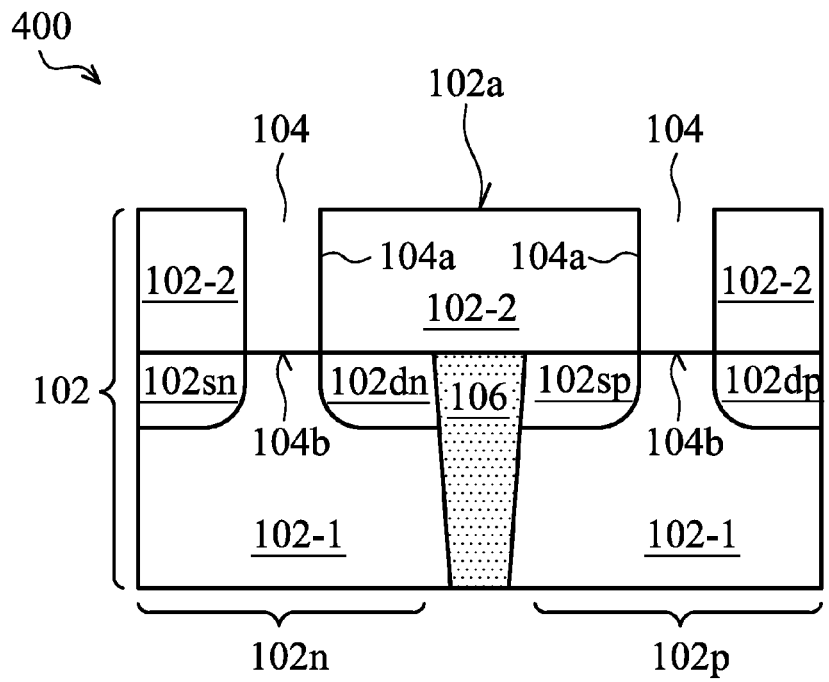
FIG. 4A to FIG. 4I show a process flow illustrating the method shown in FIG. 3, in accordance with some embodiments.

As shown in FIG. 4A in a view 400, a workpiece 102 having a recess 104 is provided.

As described above, the workpiece 102 may include the substrate 102-1 and the first insulating layer 102-2 disposed over the substrate 102-1. The first insulating layer 102-2 may be formed over the substrate 102-1 by suitable processes typical in semiconductor processing (e.g. CMOS fabrication) such as chemical vapor deposition (CVD), atomic layer deposition (ALD), spin-on coating, and/or other processes. In some embodiments, the first insulating layer 102-2 includes two or more silicon oxide layers deposited using different processes. One example is a first insulating layer 102-2 having a borophosphosilicate tetra-ethylorthosilicate (BPTEOS) layer and an undoped tetra-ethyl orthosilicate (TEOS) layer deposited using plasma.

In some embodiments, the first insulating layer 102-2 may include a dummy gate structure (not shown in FIG. 4A) that was previously formed therein. For example, as part of the above-mentioned gate-last process, the dummy gate structure may have been disposed between the source region 102$sn$ and the drain region 102$dn$ of the NMOS region 102$n$ of the workpiece 102. In like manner, another dummy gate structure may have been disposed between the source region 102$sp$ and the drain region 102$dp$ of the PMOS region 102$p$ of the workpiece 102. After forming the source regions 102$sn$, 102$sp$ and the drain regions 102$dn$, 102$dp$, the dummy gate structures may have been removed (e.g. by means of an etching process), thus producing the recesses 104.

As described above, the recess 104 may extend through (e.g. extend partially or fully through) the first insulating layer 102-2. In an embodiment, the recess 104 may be formed by means of an etching process (e.g. an etching process that may remove a dummy gate structure). The etching process may include, or may be, at least one of a wet etch process and a dry etch process (e.g. a plasma etch process), or other suitable etching processes.

In accordance with an embodiment, the etching process may be a selective etching process or a non-selective etching process. For example, in an embodiment where a dummy gate structure was previously disposed between the source region 102$sn$ and the drain region 102$dn$, the etching process may be selective to material of the dummy gate structure. In such an example, an etch mask may not be necessary during the etching of the dummy gate structure. In another embodiment, the etching process may be a non-selective etching process. In such an embodiment, a patterned etch mask may be formed over a part of the top surface 102$a$ of the workpiece 102. The patterned etch mask may be formed by depositing a masking material over the workpiece 102, and patterning the masking material to form the patterned etch mask. Patterning the masking material may include, or may consist of, a lithographic process (e.g. a photo-lithographic process). The patterned etch mask may be removed after forming the recess 104.

Figure 4B:
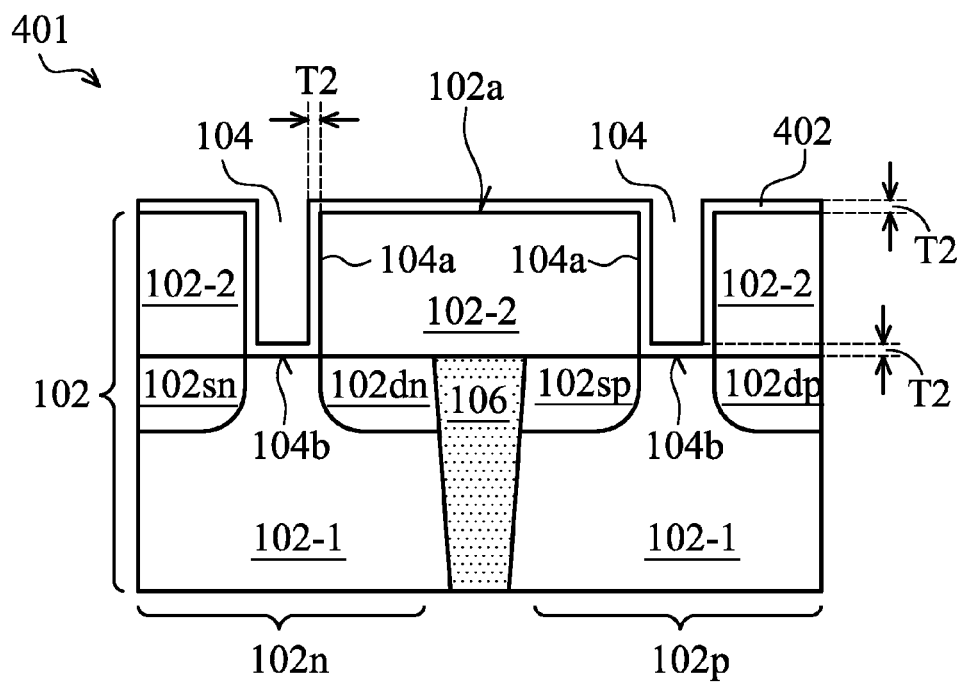

As shown in FIG. 4B in a view 401, a dielectric layer 402 may be formed over the workpiece 102.

The dielectric layer 402 lines the recess 104 (e.g. lines the bottom surface 104$b$ and the sidewall 104$a$ of the recess 104) and is further disposed over the top surface 102$a$ of the workpiece 102. In other words, the dielectric layer 402 may further line the top surface 102$a$ of the workpiece 102.

The dielectric layer 402 may be a single layer structure (e.g. including one layer of dielectric material) or a multi-layer structure (e.g. including two or more layers of dielectric material).

The dielectric layer 402 may include, or may consist of, similar materials described above in respect of the dielectric layer 108 shown in FIG. 1A. For the sake of brevity, reference is made to the description above.

In an embodiment, the dielectric layer 402 may be formed by at least one of a thermal oxidation process, a chemical vapor deposition (CVD) process, and an atomic layer deposition (ALD) process, although other processes may be possible as well in accordance with other embodiments.

Figure 4C:
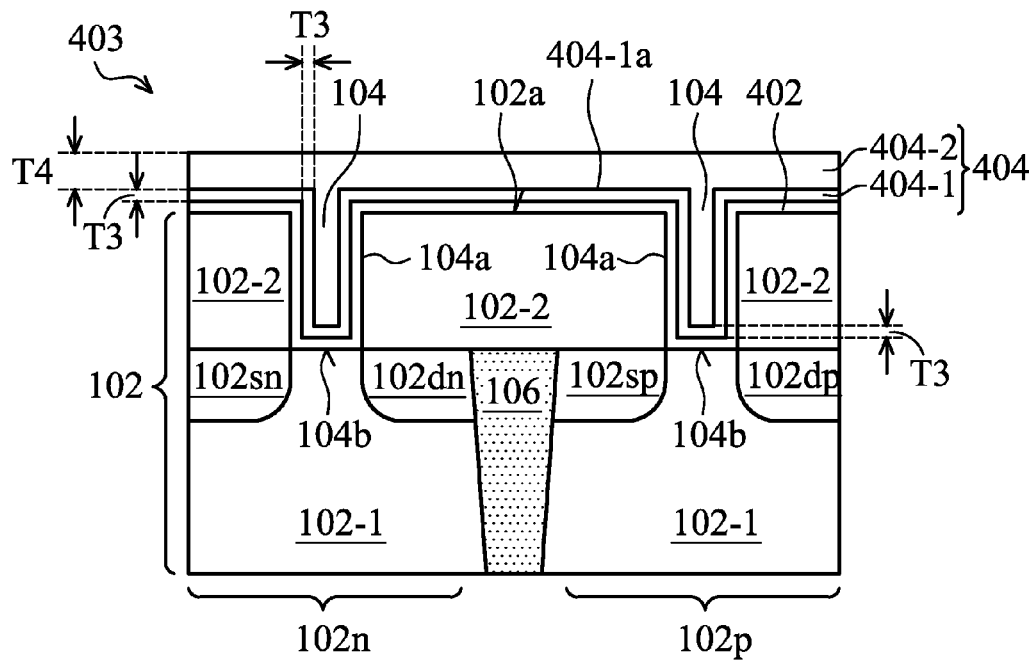

As shown in FIG. 4C in a view 403, a conductive structure 404 is formed over the dielectric layer 402.

The conductive structure 404 may fill the recess 104 and may further extend over the mouth of the recess 104 and over the top surface 102$a$ of the workpiece.

In an embodiment, the conductive structure 404 may be a single layer structure (e.g. including only one electrically conductive layer). However, in another embodiment, as in the example shown in FIG. 4C, the conductive structure 404 may be a multilayer structure (e.g. including two or more electrically conductive layers).

The example shown in FIG. 4C illustrates an embodiment where the conductive structure 404 includes two electrically conductive layers. The conductive structure 404 may include a conductive liner 404-1 and a conductive layer 404-2 disposed over the conductive liner 404-1. The conductive liner 404-1 may include, or may be, a work function metal (WFM) layer of the conductive structure 404.

The conductive liner 404-1 (e.g. WFM layer) may include a plurality of material layers in accordance with some embodiments. The conductive liner 404-1 (e.g. WFM layer) may include one or more material layers comprising Ti, Ta, Al, an organic material, or combinations or multiple layers thereof having a thickness T3 of about 10 Angstroms to about 50 Angstroms in some embodiments. In other embodiments, however, the conductive liner 404-1 may comprise other materials and/or dimensions.

As shown in FIG. 4C, the conductive liner 404-1 (e.g. WFM layer) may be formed over the dielectric layer 402. For example, the conductive liner 404-1 (e.g. WFM layer) may line the dielectric layer 402. Accordingly, the top surface 102$a$ of the workpiece 102, the sidewalls 104$a$ of the recess 104, and the bottom surface 104$b$ of the recess 104 may additionally be lined with the conductive liner 404-1 (e.g. WFM layer), with the dielectric layer 402 being an intervening layer between the mentioned surfaces and the conductive liner 404-1 (e.g. WFM layer), as shown in the example of FIG. 4C.

The conductive layer 404-2 may be formed over the conductive liner 404-1, and may fill the recess 104. As shown in the example of FIG. 4C, the conductive layer 404-2 may additionally be disposed over the dielectric layer 402 and the top surface 102$a$ of the workpiece 102.

The conductive structure 404 (e.g. the conductive liner 404-1 and the conductive layer 404-2) may include, or may consist of, similar materials described above in respect of the conductive structure 110 shown in FIG. 1A. For the sake of brevity, reference is made to the description above.

The conductive layer 404-2 may extend above a top surface 404-1a of the conductive liner 404-1 by a thickness T4. In an embodiment, the thickness T4 may be in a range from about 15 nm to about 40 nm, although other thicknesses may be possible in accordance with other embodiments.

In some embodiments, the conductive structure 404 (e.g. the conductive liner 404-1 and the conductive layer 404-2) may be formed by means of low-pressure chemical vapor deposition (LPCVD), plasma enhanced chemical vapor deposition (PECVD), electro-chemical plating (ECP), or combinations thereof, although other processes may be possible as well in accordance with other embodiments.

Figure 4D:
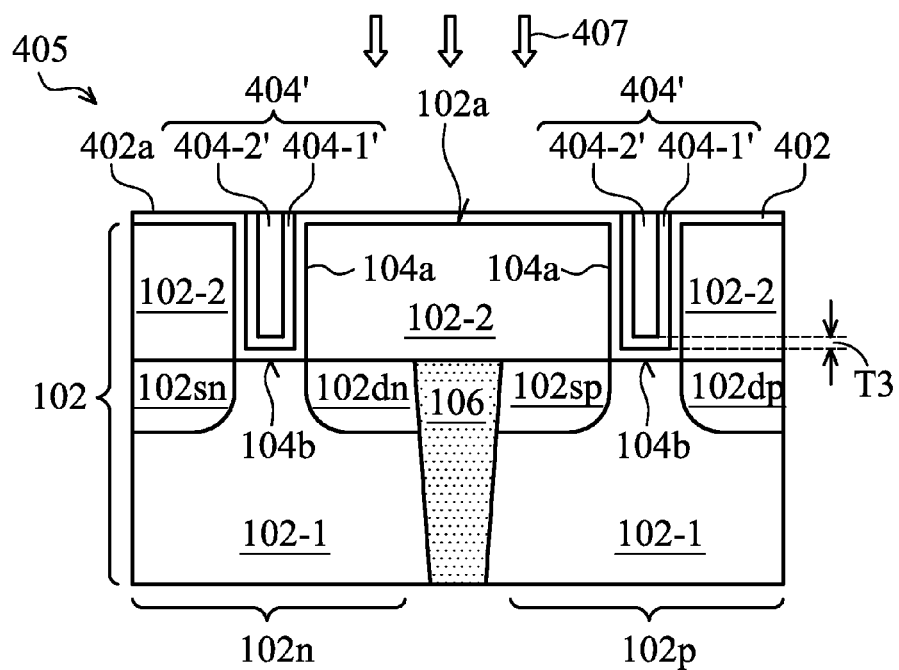

As shown in FIG. 4D in a view 405, a planarizing process 407 may be used to remove a portion of the conductive structure 404 shown in FIG. 4C to form a planarized conductive structure 404'.

As shown in FIG. 4D, the planarized conductive structure 404' fills the recess 104. The planarized conductive structure 404' includes a planarized conductive layer 404-1' and a planarized conductive layer 404-2'.

The portion of the conductive structure 404 shown in FIG. 4C that is removed by the planarizing process 407 may include portions of the conductive structure 404 disposed over the top surface 102a of the workpiece 102 and portions of the conductive structure 404 disposed over the mouth of the recess 104. As shown in FIG. 4D, the planarizing process 407 exposes the dielectric layer 402 lining the top surface 102a of the workpiece 102.

As shown in the example of FIG. 4D, a top surface of the planarized conductive structure 404' may be substantially co-planar with a top surface 402a of the dielectric layer 402 disposed over (e.g. lining) the top surface 102a of the workpiece 102. In other words, a top surface of the planarized conductive layer 404-1' and a top surface of the planarized conductive layer 404-2' may be substantially co-planar with the top surface 402a of the dielectric layer 402, as shown in FIG. 4D.

In an embodiment, the planarizing process 407 may include, or may be, a chemical-mechanical polish (CMP) process and/or an etch process (e.g. a wet and/or dry etch process), although other planarizing processes may be possible as well in accordance with other embodiments.

Figure 4E:
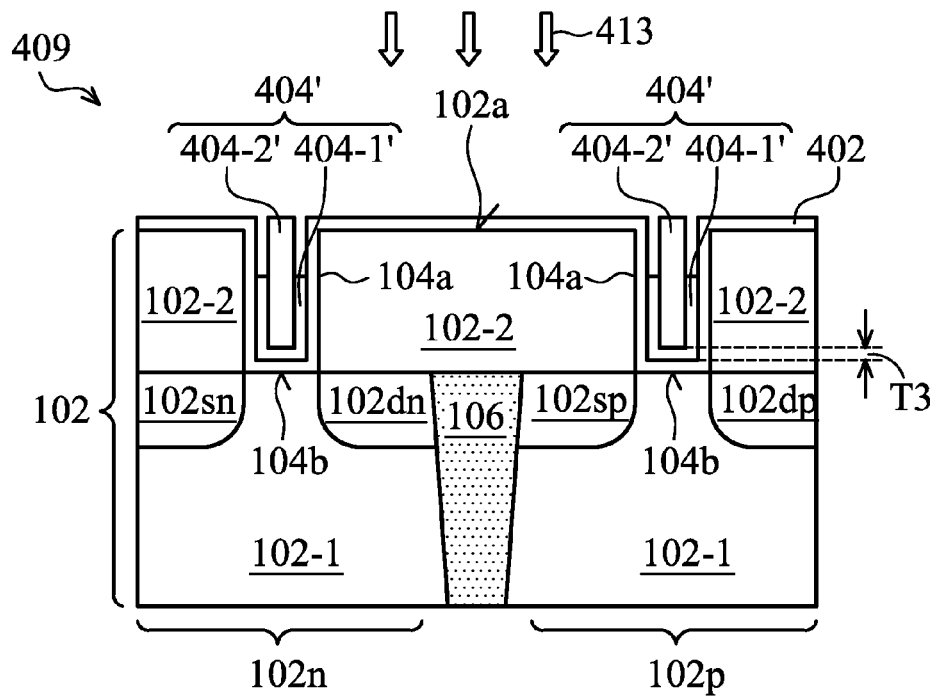
Figure 4F:
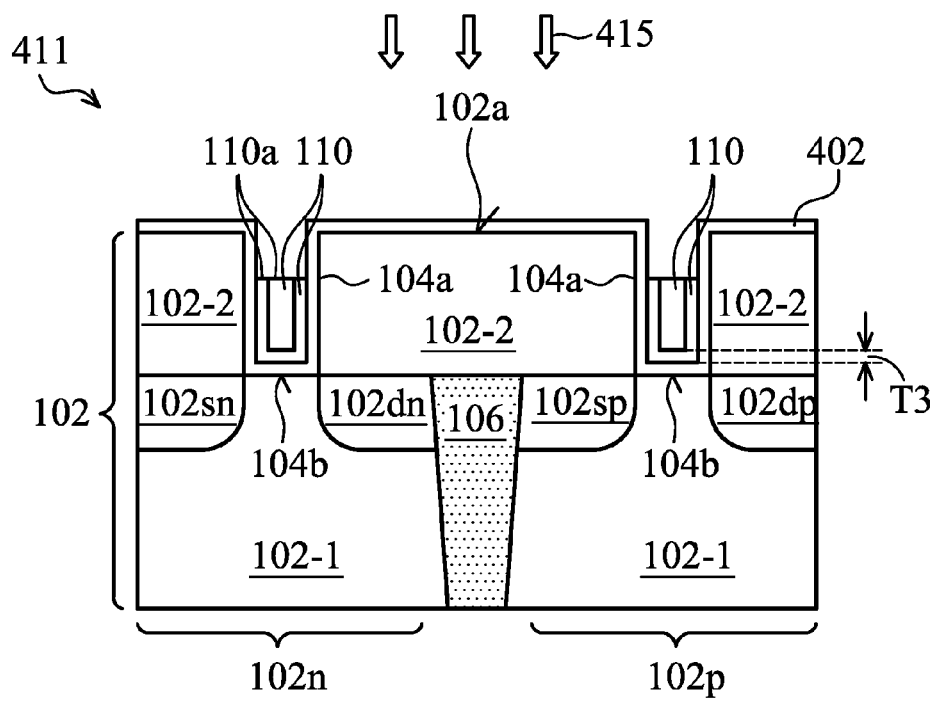

As shown in FIG. 4E in a view 409 and FIG. 4F in a view 411, the planarized conductive structure 404' shown in FIG. 4D may be recessed by means of an etch process 413 and an etch process 415 to form the conductive structure 110 (e.g. shown and described above in FIG. 1A).

As shown in FIG. 4F, the conductive structure 110 partially fills the recess 104. In other words, the top surface 110a of the conductive structure 110 is disposed with the recess 104.

In one or more embodiments, the etch process 413 may recess the planarized conductive liner 404-1', and the etch process 415 may recess the planarized conductive layer 404-2'. In the example shown in FIG. 4E and FIG. 4F, the planarized conductive liner 404-1' is recessed prior to the planarized conductive layer 404-2'. However, in another embodiment, the planarized conductive layer 404-2' may be recessed prior to the planarized conductive liner 404-1'.

In one or more embodiments, the etch process 413 and/or the etch process 415 may include an etch process chemistry of $SF_6$, $O_2$, $NF_3$, $CF_4$, and/or combinations thereof, although other etch chemistries may be possible as well in accordance with other embodiments. For example the etch process 413 and/or the etch process 415 may include an etch chemistry of $Cl_2$, $BCl_3$, and/or combinations thereof in some embodiments.

The etch process 413 and/or the etch process 415 for recessing the planarized conductive structure 404' may include a flow rate in a range from about 10 standard cubic centimeters per minute (sccm) to about 200 sccm, and a pressure in a range from about 1 mT to about 30 mT, in some embodiments.

The etch process 413 and/or the etch process 415 may be performed at a chuck temperature of about 30° C. to about 60° C. and/or a chamber wall temperature of about 50° C. to about 90° C., in some embodiments. For example, the semiconductor device 100 or the semiconductor device 200 may be in wafer form, and may be placed on a support or chuck, such as an electronic static chuck (ESC), in a processing chamber. The temperature of the chuck and/or a wall of the chamber may be monitored and controlled to above-mentioned temperatures, in some embodiments. It is noted that the etch process 413 and/or the etch process 415 for recessing the planarized conductive structure 404', thereby forming the conductive structure 110, may include other etch chemistries, flow rates, pressures, temperatures, and processing parameters.

In an embodiment, the etch process 413 and/or the etch process 415 may include, or may be, a selective etch process or a non-selective etch process. For example, a selective etch process 413 may be selective to material of the planarized conductive liner 404-1' and a selective etch process 415 may be selective to material of the planarized conductive layer 404-2'. In the case of a selective etch process, an etch mask may not be necessary during the etching of the planarized conductive liner 404-1' and/or the planarized conductive layer 404-2'. In another embodiment, the etch process 413 and/or the etch process 415 may be a non-selective etching process. In such an embodiment, a patterned etch mask may be formed over a part of the top surface 102a of the workpiece 102. The patterned etch mask may be formed by depositing a masking material over the workpiece 102, and patterning the masking material to form the patterned etch mask. Patterning the masking material may include, or may consist of, a lithographic process (e.g. a photo-lithographic process). The patterned etch mask may be removed after forming the conductive structure 110.

Figure 4G:
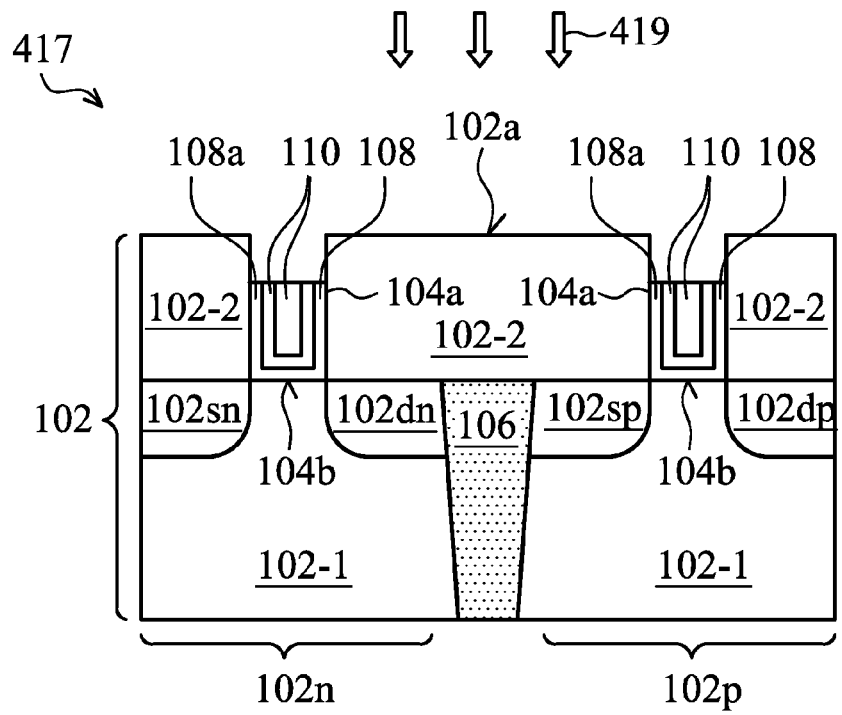

As shown in FIG. 4G in a view 417, the dielectric layer 402 shown in FIG. 4F may be recessed (e.g. by means of an etch process 419) to form the dielectric layer 108 (e.g. shown and described above in FIG. 1A).

Portions of the dielectric layer 402 free from the conductive structure 110 may be removed by the etch process 419. For example, the dielectric layer 402 disposed over the top surface 102a of the workpiece 102 may be removed by means of the etch process 419. Additionally, the dielectric layer 402 lining an upper portion of the sidewalls 104a of the recess 104 that is free from the conductive structure 110 may be removed by means of the etch process 419. For example, portions of the dielectric layer 402 not having contact (e.g. physical contact) with the conductive structure 110 may be removed by means of the etch process 419.

As a result of the etch process 419, a lower portion of the sidewalls 104a of the recess 104 and the bottom surface 104b the recess 104 are lined with dielectric layer 108 (which may also be referred to as the recessed dielectric layer 108).

After the recessing, the top surface 108a of the recessed dielectric layer 108 may be disposed within the recess 104, as shown in FIG. 4G. In the embodiment shown in FIG. 4G, the top surface 108a of the recessed dielectric layer 108 is substantially co-planar with the top surface of the conductive structure 110. In another embodiment, the top surface 108a of the recessed dielectric layer 108 and the top surface of the conductive structure 110 may be disposed at different levels. However, in all embodiments, the top surfaces of the recessed dielectric layer 108 and the conductive structure 110 are disposed within the recess 104.

The etch process 419 may include, or may consist of, an etch chemistry of $Cl_2$, $BCl_3$, $O_2$ and/or combinations thereof in some embodiments.

As described above, the dielectric layer 108 may include, or may consist of, a high-k dielectric material. In such an embodiment, the etch process 419 for recessing the high-k material of the dielectric layer 402 may be summarized by the method 500 shown in FIG. 5.

Figure 5:
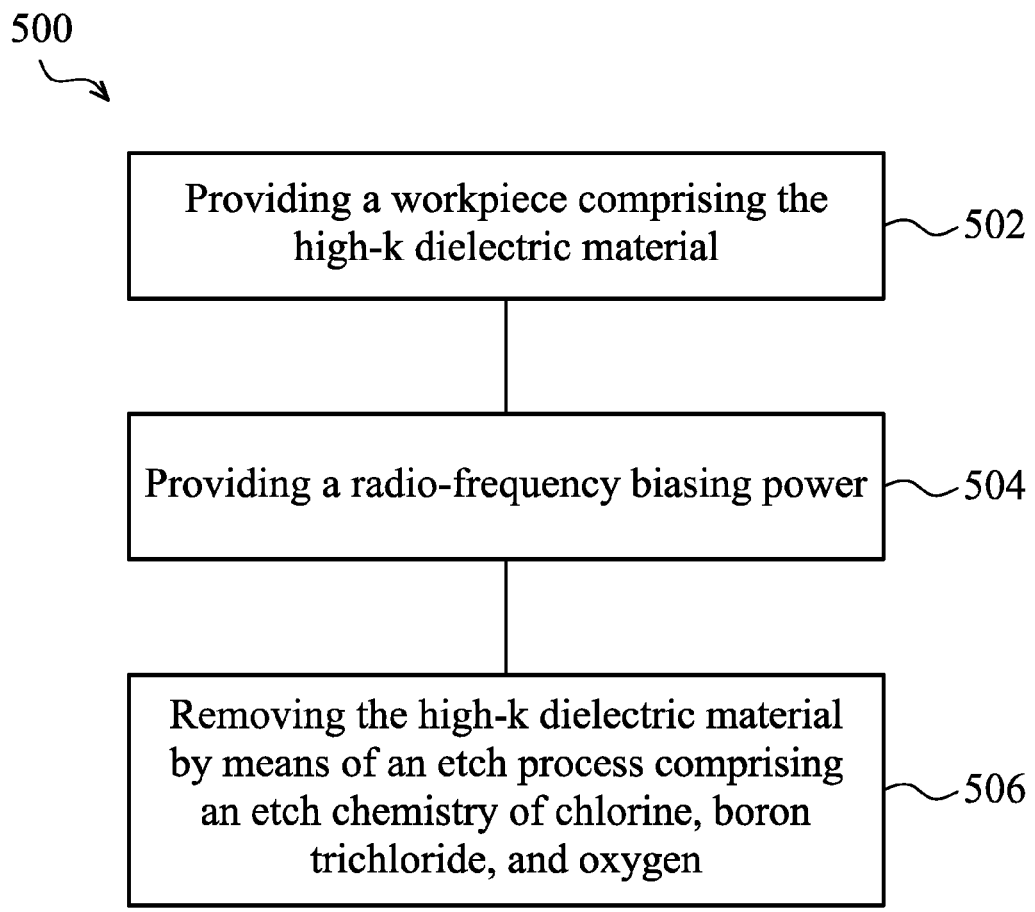
FIG. 5 shows a method of removing a high-k dielectric material, in accordance with some embodiments.

FIG. 5 shows a method 500 for removing a high-k dielectric material, in accordance with some embodiments.

The method 500 may, for example, be identified with the etch process 419 shown in FIG. 4G.

The method 500 may include: providing a workpiece comprising the high-k dielectric material (in 502); providing a radio-frequency biasing power (in 504); and removing the high-k dielectric material by means of an etch process comprising an etch chemistry of chlorine, boron trichloride, and oxygen (in 506).

In an embodiment, the method 500 may be performed in a chamber having a pressure in a range from about 2 milliTorrs to about 10 milliTorrs, although other pressures may be possible as well in accordance with other embodiments.

In an embodiment, a flow rate of the chlorine (e.g. $Cl_2$) may be in a range from about 10 sccm to about 50 sccm, although other chlorine flow rates may be possible as well in accordance with other embodiments.

In an embodiment, a flow rate of the boron trichloride (e.g. $BCl_3$) is in a range from about 100 sccm to about 800 sccm, although other boron trichloride flow rates may be possible as well in accordance with other embodiments.

In an embodiment, a flow rate of the oxygen (e.g. $O_2$) is in a range from about 1 sccm to about 10 sccm, although other oxygen flow rates may be possible as well in accordance with other embodiments.

In an embodiment, the radio-frequency biasing power may be in a range from about 200 Watts to about 1000 Watts. In another embodiment, the radio-frequency biasing power may be in a range from about 5 Volts to about 20 Volts. It is noted that other voltages and/or powers may be possible as well in accordance with other embodiments.

An effect provided by parameters of the method 500 being in the above-identified ranges is that the etch process 419 is highly selective to material of the dielectric layer 402. In other words, the etch process would be able to remove the high-k dielectric layer while leaving other material substantially unperturbed. In the context of FIG. 4G, the etch process 419, if performed in the above-identified ranges, could remove portions of the dielectric layer 402 while leaving the conductive structure 110 and the first insulating layer 102-2 substantially unperturbed.

Figure 4H:
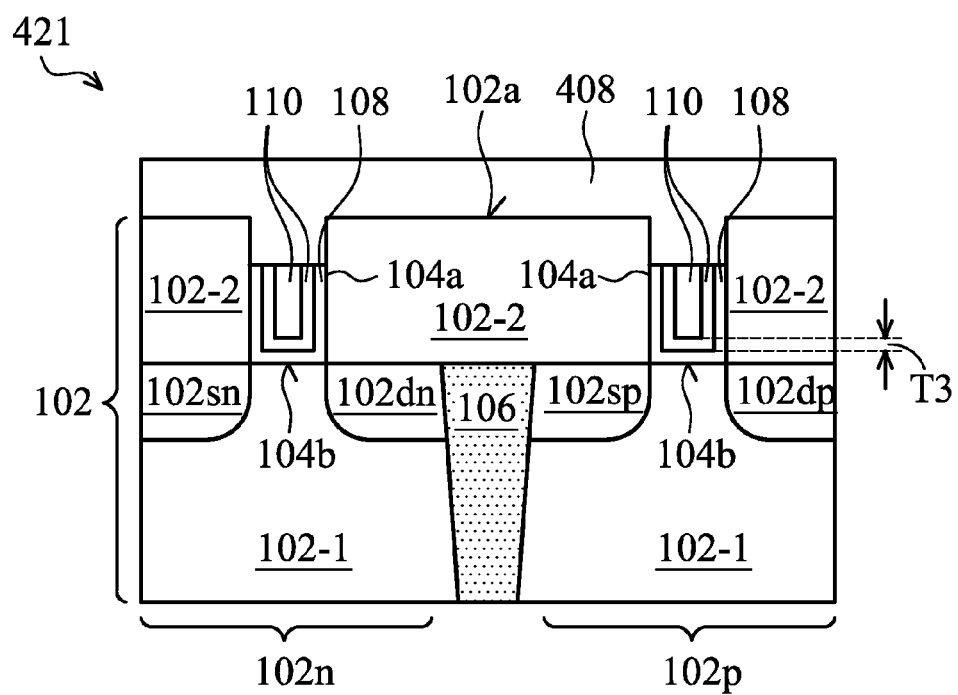

As shown in FIG. 4H in a view 421, a second insulating layer 408 may be formed over the conductive structure 110, the recessed dielectric layer 108, and the top surface 102a of the workpiece 102.

The second insulating layer 408 may include, or may consist of, similar materials described above in respect of the second insulating layer 112 shown in FIG. 1A. For the sake of brevity, reference is made to the description above.

The second insulating layer 408 may be formed by means of depositing an insulating material over the workpiece 102. For example, the deposited insulating material may fill the recess 104 and may be additionally disposed over the top surface 102a of the workpiece 102.

The deposition of the insulating material may be performed by means of furnace chemical vapor deposition (FCVD), low-pressure chemical vapor deposition (LPCVD), plasma enhanced chemical vapor deposition (PECVD), or combinations thereof, although other processes may be possible as well in accordance with other embodiments.

Figure 4I:
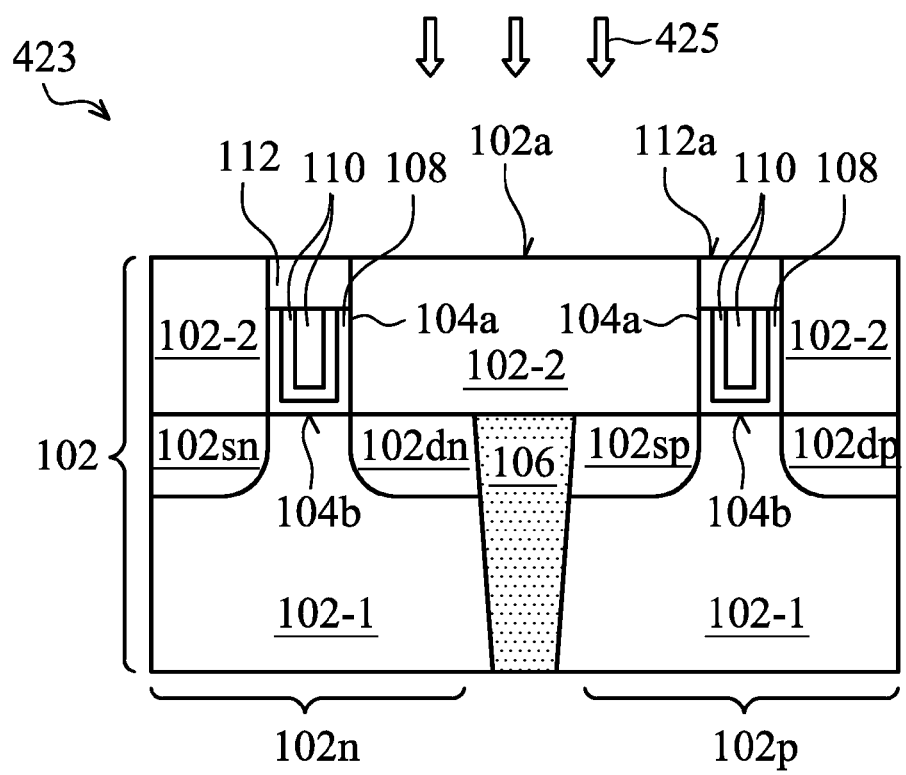

As shown in FIG. 4I in a view 423, the second insulating layer 408 may subsequently be planarized (e.g. by means of planarizing process 425) to form the second insulating layer 112.

The planarizing process 425 may remove portions of the second insulating layer 408 that may be disposed over the top surface 102a of the workpiece 102 and potions of the second insulating layer 408 that may be disposed over the mouth of the recess 104.

As shown in the example of FIG. 4I, a top surface 112a of the planarized second insulating layer 112 may be substantially co-planar with the top surface 102a of the workpiece 102. Furthermore, the planarized second insulating layer 112 may cover the top surface 108a of the recessed dielectric layer 108 and the top surface 110a of the conductive structure 110 formed within the recess 104.

In one or more embodiments, the planarizing process 425 may include, or may be, a chemical-mechanical polish (CMP) process and/or an etch process, although other processes may be used in accordance with other embodiments.

The semiconductor device shown in FIG. 4I may subsequently be subjected to a cleaning process. For example, the top surface 102a of the workpiece 102 and a top surface 112a of the second insulating layer 112 may be subjected to a wet clean process, which may involve use of an acid (e.g. hydrofluoric acid, HF).

As described above, the planarized second insulating layer 112 may cover the top surface 110a of the conductive structure 110 and the top surface 108a of the dielectric layer 108, both of which are disposed within the recess 104 and below the second insulating layer 112. An effect provided by such an arrangement may be that the dielectric layer 108 is protected from the cleaning process (e.g. wet clean process). In other words, the dielectric layer 108 is not exposed to the cleaning process (e.g. wet clean process). Consequently, the dielectric layer 108 is not etched (e.g. partially etched) by the cleaning process (e.g. wet clean process, e.g. with HF), and thus, the integrity of the dielectric layer 108 is preserved. This can reduce resistance drift in the semiconductor device (e.g. planar transistor) manufactured according to the process flow shown in FIG. 4A to FIG. 4I. Furthermore, by preserving the integrity of the dielectric layer 108, a cleaning agent (e.g. an etchant) used during the cleaning process (e.g. wet clean process) is prevented from contacting the conductive structure 110 (e.g. gate electrode). Accordingly, loss of material from the conductive structure 110 (e.g. gate electrode) is reduced or prevented, and the integrity of the conductive structure 110 (e.g. gate electrode) is also preserved. As a result, gate loss events in the semiconductor device are reduced or prevented. In summary, by disposing the top surface 110a of the conductive structure 110 and the top surface 108a of the dielectric layer 108 within the recess 104, and by covering these surfaces with the second insulating layer 112, defects in the semiconductor device (e.g. defects in the dielectric layer 108 and/or the conductive structure 110) are reduced or prevented, and this leads to better electrical performance of the semiconductor device.

Figure 6:
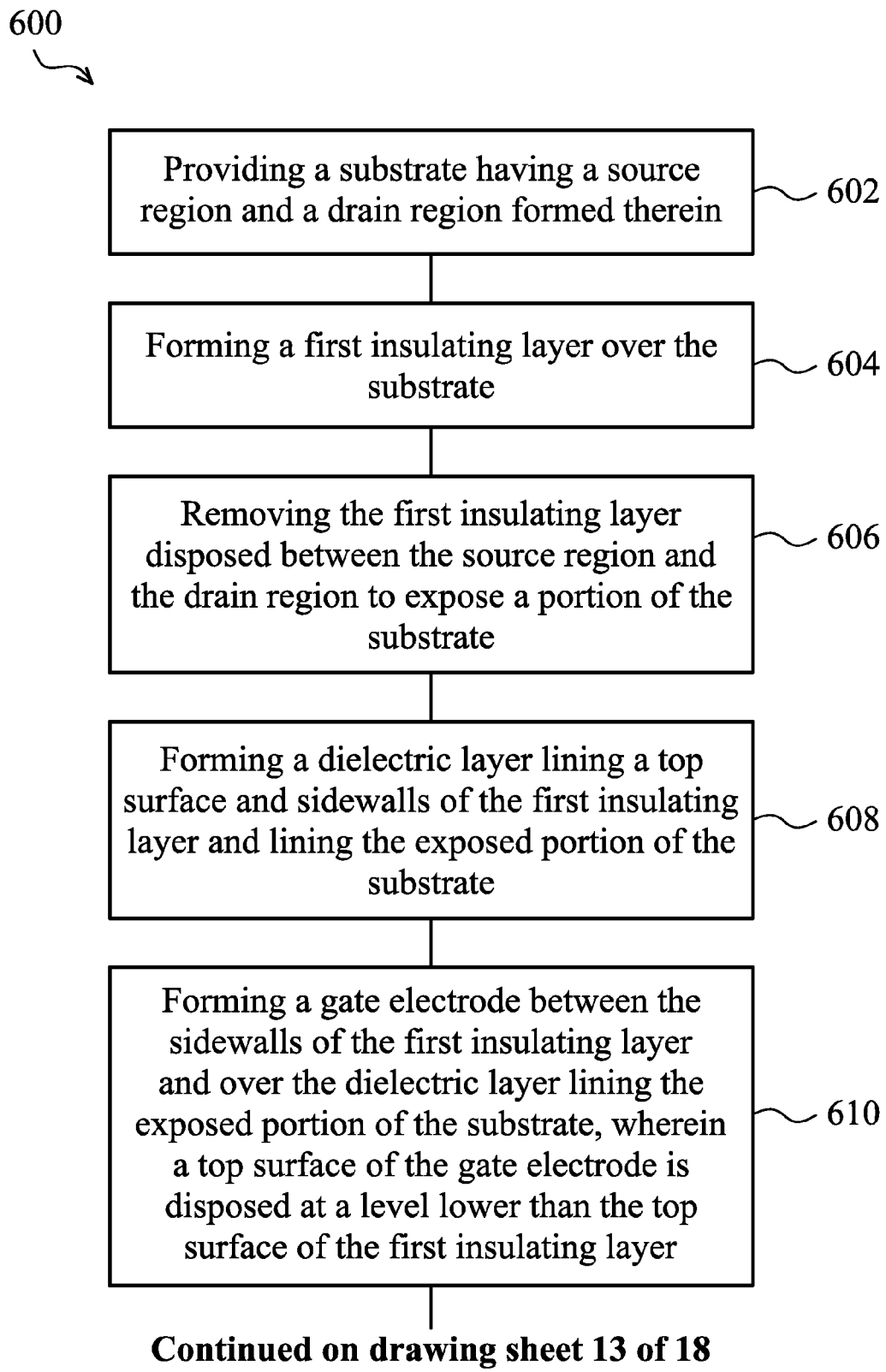
FIG. 6 shows a method of manufacturing a semiconductor device, in accordance with some embodiments.

FIG. 6 shows a method 600 of manufacturing a semiconductor device, in accordance with some embodiments.

The method 600 may include: providing a substrate having a source region and a drain region formed therein (in 602); forming a first insulating layer over the substrate (in 604); removing the first insulating layer disposed between the source region and the drain region to expose a portion of the substrate (in 606); forming a dielectric layer lining a top surface and sidewalls of the first insulating layer and lining the exposed portion of the substrate (in 608); forming a gate electrode between the sidewalls of the first insulating layer and over the dielectric layer lining the exposed portion of the substrate, wherein a top surface of the gate electrode is disposed at a level lower than the top surface of the first insulating layer (610); and recessing the dielectric layer, wherein, after the recessing, the recessed dielectric layer lines a lower portion of the sidewalls of the first insulating layer and the exposed portion of the substrate (in 612).

The method 600 may optionally include: forming a second insulating layer over the gate electrode and over the recessed dielectric layer, wherein the second insulating layer covers a top surface of the recessed dielectric layer and the top surface of the gate electrode (in 614).

FIG. 7A to FIG. 7I show a process flow illustrating the method 600 of manufacturing a semiconductor device, in accordance with one or more embodiments.

Reference signs in FIG. 7A to FIG. 7I that are the same as in FIG. 2A and FIG. 4A to FIG. 4I denote the same or similar elements as in FIG. 2A and FIG. 4A to FIG. 4I. Thus, those elements will not be described in detail again here; reference is made to the description above for the sake of brevity.

The process flow shown in FIG. 7A to FIG. 7I may, for example, be part of a gate-last process, where a gate electrode is formed after forming source and drain regions in the workpiece 102 (e.g. in the substrate 102-1 of the workpiece 102, e.g. in the fin 202 of the substrate 102-1 of the workpiece 102).

The description that follows describes the method 600 in the context of manufacturing the semiconductor device 200 (e.g. FinFET). However, it may be noted that the method 600 may analogously be applied to the manufacture of the semiconductor device 100 (e.g. planar transistor).

Figure 7A:
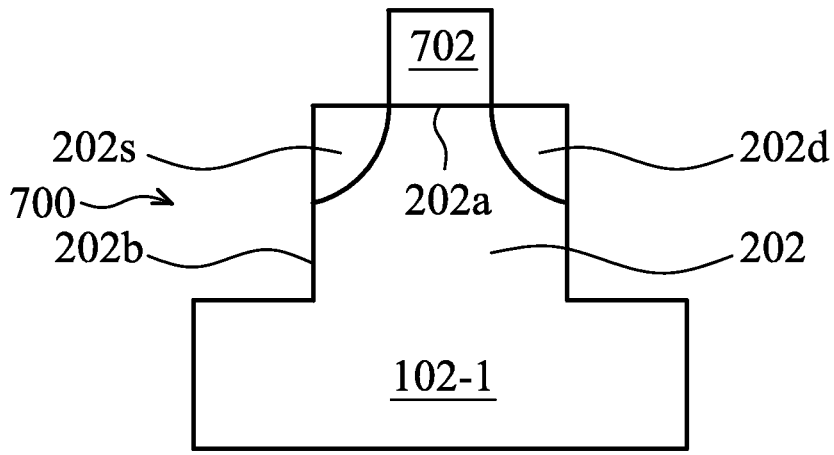
FIG. 7A to FIG. 7I show a process flow illustrating the method shown in FIG. 6, in accordance with some embodiments.

As shown in FIG. 7A in a view 700, a substrate 102-1 may be provided.

The substrate 102-1 may have a fin 202 in which a source region 202s and a drain region 202d may be formed (e.g. by means of an epitaxial process). The arrangement shown in FIG. 7A may include a dummy gate structure 702 disposed over the top surface 202a of the fin 202. The dummy gate structure 702 may be disposed between the source region 202s and the drain region 202d of the fin 202. The dummy gate structure 702 may be formed over the top surface 202a of the fin 202 prior to forming the source region 202s and the drain region 202d. This may, for example, be the case in a gate-last process.

In an embodiment, the dummy gate structure 702 may include, or may consist of, at least one of polycrystalline silicon, amorphous silicon, although other materials may be possible as well in accordance with other embodiments. Methods and processes for forming the dummy gate structure 702 are known in the art, and are not described here for the sake of brevity.

Figure 7B:
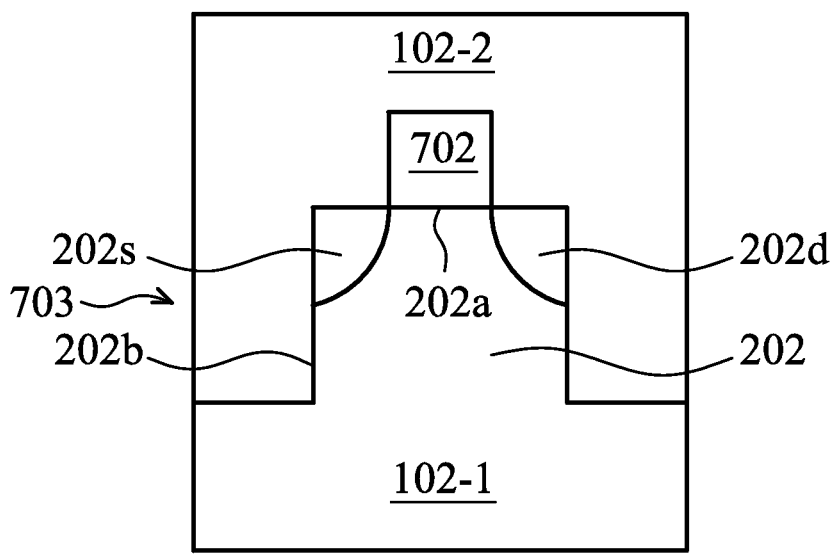

As shown in FIG. 7B in a view 703, the first insulating layer 102-2 may be formed over the substrate 102-1.

The first insulating layer 102-2 may be formed by means of furnace chemical vapor deposition (FCVD), low-pressure chemical vapor deposition (LPCVD), plasma enhanced chemical vapor deposition (PECVD), or combinations thereof, although other processes may be possible as well in accordance with other embodiments.

Figure 7C:
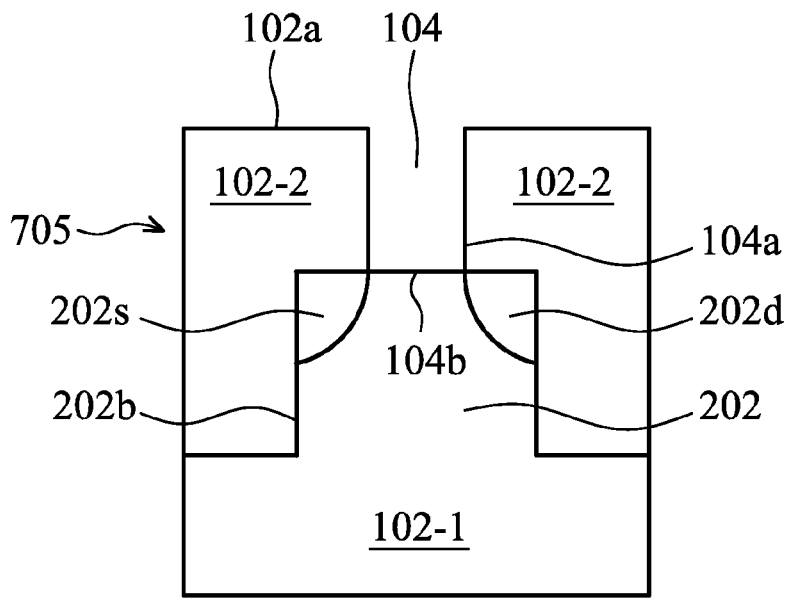

As shown in FIG. 7C in a view 705, the first insulating layer 102-2 disposed between the source region 102sn, 102sp and the drain region 102dn, 102dp may be removed to expose a portion of the substrate 102-1 (e.g. a portion of the fin 202 of the substrate 102-1).

In an embodiment, the first insulating layer 102-2 disposed between the source region 202s and the drain region 202d may additionally be disposed over the dummy gate structure 702, as shown in FIG. 7B. Accordingly, removing the first insulating layer 102-2 disposed between the source region 202s and the drain region 202d may include removing the dummy gate structure 702.

As shown in FIG. 7C, a recess 104 may be formed as a result of exposing the portion of the substrate 102 (e.g. a portion of the fin 202 of the substrate 102-1) disposed between the source region 202s and a drain region 202d.

As shown in FIG. 7C, the bottom surface 104b of the recess 104 may include, or may be, a top surface of the exposed portion of the substrate 102-1. Furthermore, the bottom surface 104b of the recess 104 may include a portion of a top surface of the fin 202 of the substrate 102-1, as shown in FIG. 7C. In like manner, the sidewall 104a of the recess 104 may include, or may be, a sidewall of the first insulating layer 102-2. Similarly, the top surface 102a of the workpiece 102 may include, or may be, a top surface of the first insulating layer 102-2.

Subsequent to exposing the portion of the substrate 102-1 disposed between the source region 202s and the drain region 202d, the process flow may proceed in a manner similar to that described above in respect of FIG. 4B to FIG. 4I.

Figure 7D:
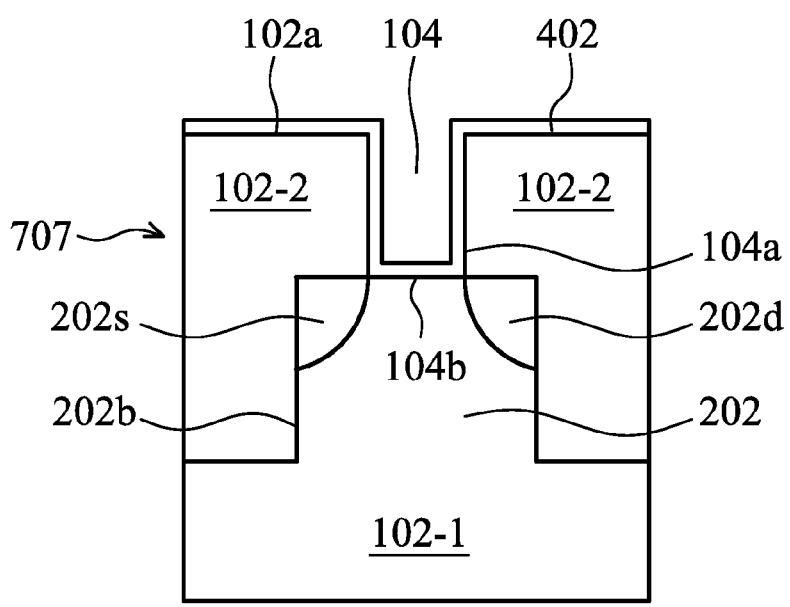

For example, as shown in FIG. 7D in a view 707, a dielectric layer 402 may be formed. The dielectric layer 402 may line the top surface 102a and the sidewalls 104a of the first insulating layer 102-2. The dielectric layer 402 may additionally line the exposed portion of the substrate 102-1 (namely, the bottom surface 104b of the recess 104).

Figure 7E:
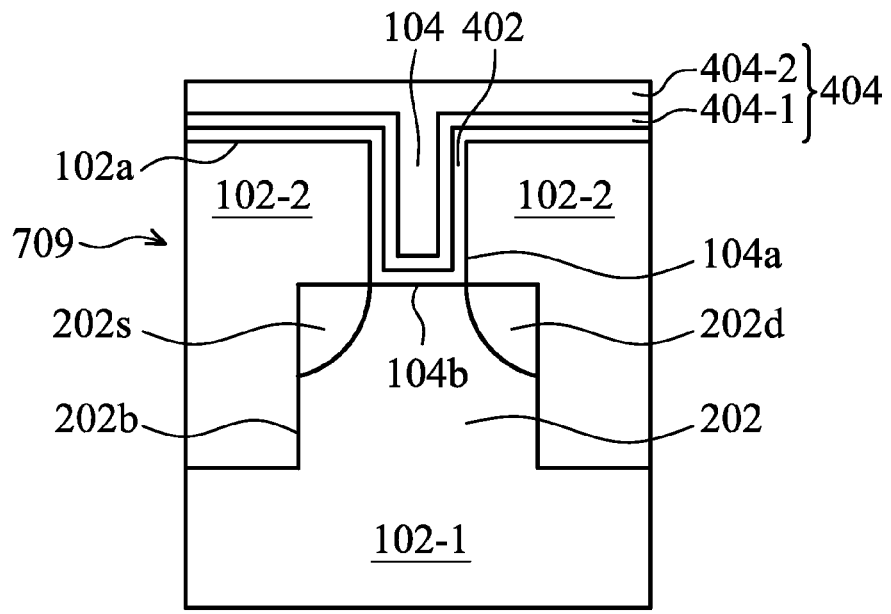

As shown in FIG. 7E in a view 709, a conductive structure 404 (which may include conductive liner 404-1 and conductive layer 404-2) is formed over the dielectric layer 402.

Figure 7F:
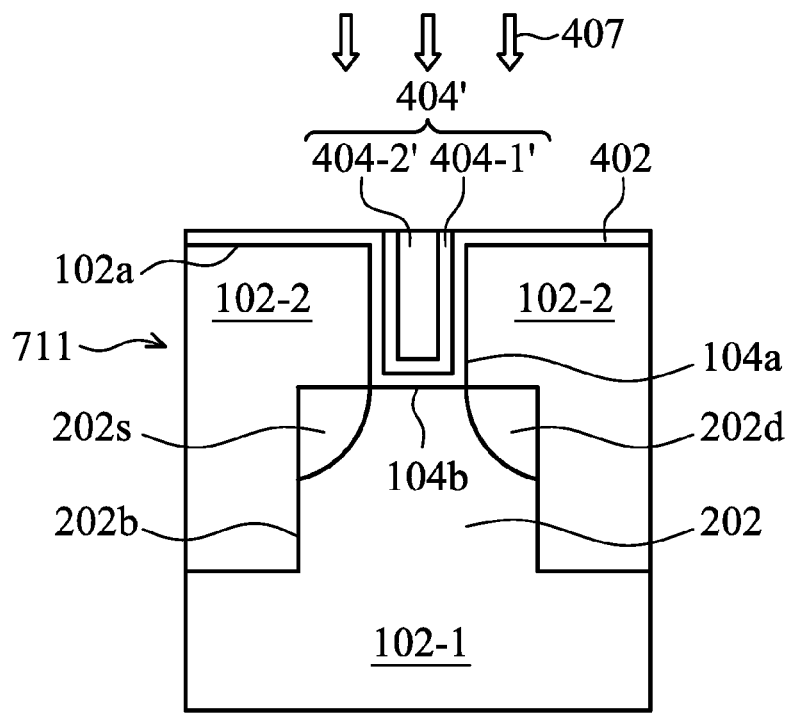

As shown in FIG. 7F in a view 711, the planarizing process 407 may be used to remove a portion of the conductive structure 404 shown in FIG. 7E to form a planarized conductive structure 404'.

Figure 7G:
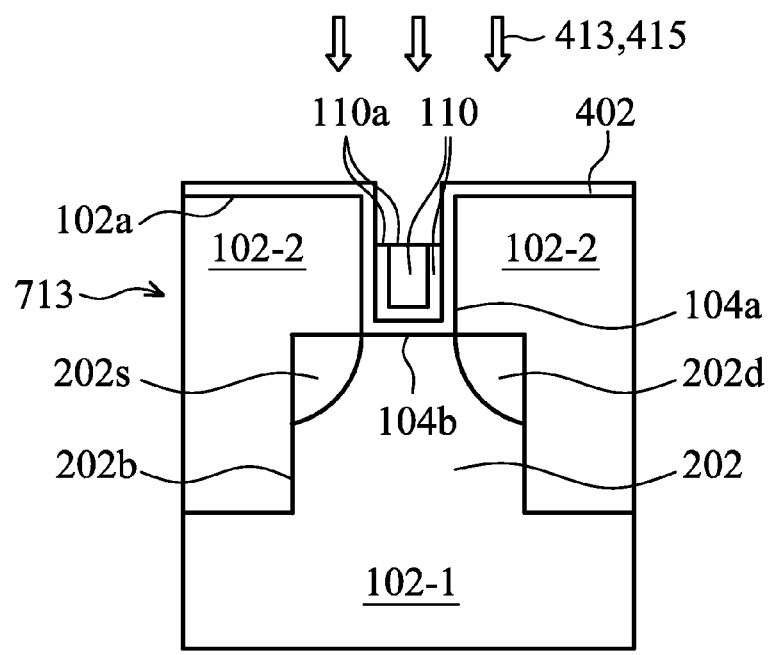

As shown in FIG. 7G in a view 713 the conductive structure 110 is formed (e.g. by means of the etch process 413 and the etch process 415 described above).

As described above, the conductive structure 110 may be a gate electrode. Accordingly, the conductive structure 110 may be a gate electrode that is formed between the sidewalls 104a of the first insulating layer 102-2 and over the dielectric layer 402 lining the exposed portion of the substrate 102-1 (e.g. the exposed portion of the fin 202 of the substrate 102-1). As shown in FIG. 7G, a top surface 110a of the conductive structure 110 (e.g. gate electrode) is disposed at a level lower than the top surface 102a of the first insulating layer 102-2.

Figure 7H:
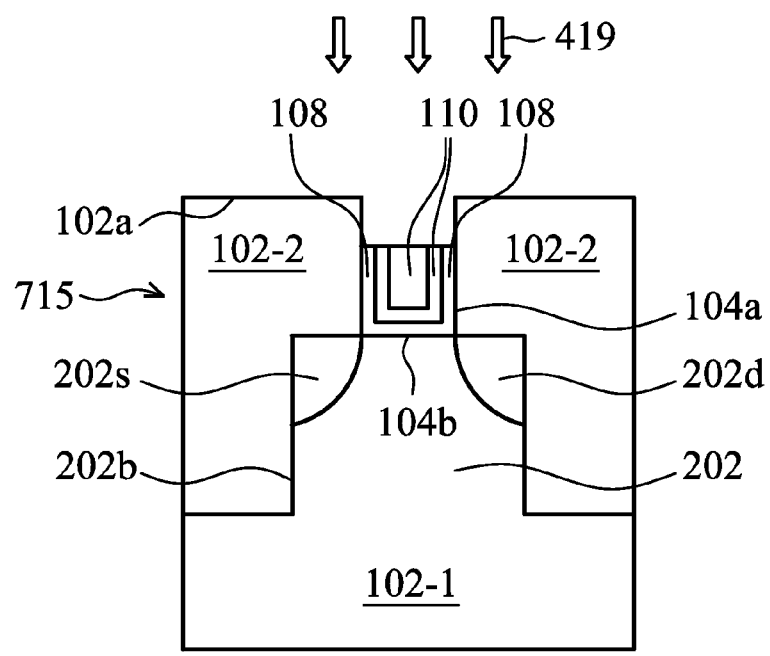

As shown in FIG. 7H in a view 715, the dielectric layer 402 shown in FIG. 7G may be recessed (e.g. by means of the etch process 419) to form the recessed dielectric layer 108. The recessed dielectric layer 108 may line a lower portion of the sidewalls of the first insulating layer 102-2 and the exposed portion of the substrate 102-1 (e.g. a portion of the fin 202 of the substrate 102-1). Furthermore, the top surface 108a of the recessed dielectric layer 108 may be substantially co-planar with the top surface 110a of the conductive structure 110 (e.g. gate electrode), as shown in FIG. 7H.

Figure 7I:
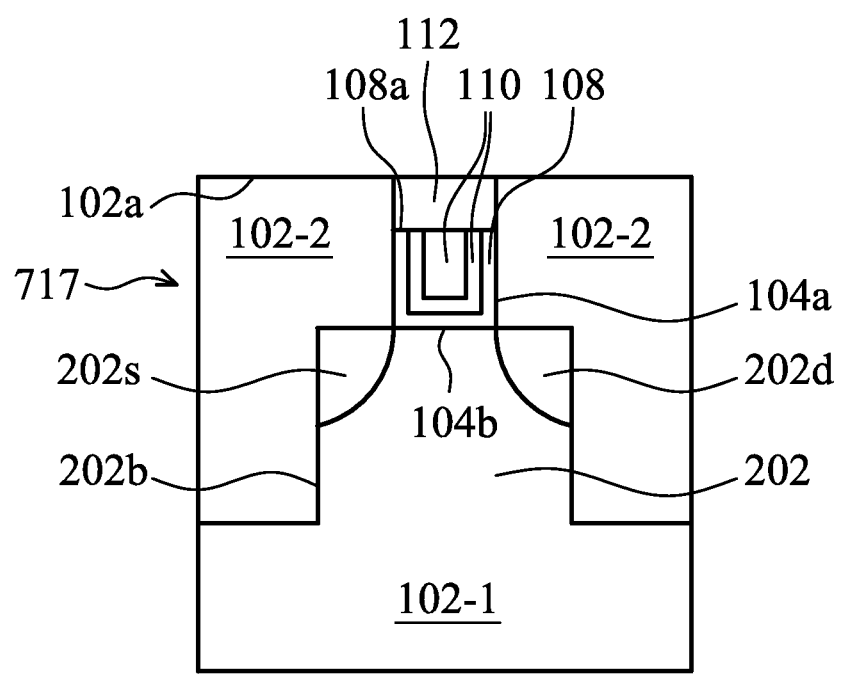

As shown in FIG. 7I in a view 717, the second insulating layer 112 may be formed. The second insulating layer 112 may fill the recess 104 and may cover the top surface of the recessed dielectric layer 108 and the top surface of the conductive structure 110 (e.g. gate electrode).

The semiconductor device shown in FIG. 7I may subsequently be subjected to a cleaning process. For example, the top surface 102a of the workpiece 102 and a top surface of the second insulating layer 112 may be subjected to a wet clean process, which may involve use of an acid (e.g. hydrofluoric acid, HF).

As described above, the planarized second insulating layer 112 may cover the top surface 110a of the conductive structure 110 and the top surface 108a of the dielectric layer 108, both of which are disposed within the recess 104 and below the second insulating layer 112. An effect provided by such an arrangement may be that the dielectric layer 108 is protected from the cleaning process (e.g. wet clean process). In other words, the dielectric layer 108 is not exposed to the cleaning process (e.g. wet clean process). Consequently, the dielectric layer 108 is not etched (e.g. partially etched) by the cleaning process (e.g. wet clean process, e.g. with HF), and thus, the integrity of the dielectric layer 108 is preserved. This can reduce resistance drift in the semiconductor device (e.g. FinFET) manufactured according to the process flow shown in FIG. 7A to FIG. 7I. Furthermore, by preserving the integrity of the dielectric layer 108, a cleaning agent (e.g. an etchant) used during the cleaning process (e.g. wet clean process) is prevented from contacting the conductive structure 110 (e.g. gate electrode). Accordingly, loss of material from the conductive structure 110 (e.g. gate electrode) is reduced or prevented, and the integrity of the conductive structure 110 (e.g. gate electrode) is also preserved. As a result, gate loss events in the semiconductor device are reduced or prevented. In summary, by disposing the top surface 110a of the conductive structure 110 and the top surface 108a of the dielectric layer 108 within the recess 104, and by covering these surfaces with the second insulating layer 112, defects in the semiconductor device (e.g. defects in the dielectric layer 108 and/or the conductive structure 110) are reduced or prevented, and this leads to better electrical performance of the semiconductor device.

According to various embodiments presented herein, a method of manufacturing a semiconductor device is provided. The method may include: providing a workpiece having a recess and a dielectric layer lining the recess; forming a conductive structure within the recess, wherein the conductive structure partially fills the recess; and recessing the dielectric layer, wherein, after the recessing, a top surface of the recessed dielectric layer is disposed within the recess.

According to various embodiments presented herein, a method of manufacturing a semiconductor device is provided. The method may include: providing a substrate having a source region and a drain region formed therein; forming a first insulating layer over the substrate; removing the first insulating layer disposed between the source region and the drain region to expose a portion of the substrate; forming a dielectric layer lining a top surface and sidewalls of the first insulating layer and lining the exposed portion of the substrate; forming a gate electrode between the sidewalls of the first insulating layer and over the dielectric layer lining the exposed portion of the substrate, wherein a top surface of the gate electrode is disposed at a level lower than the top surface of the first insulating layer; and recessing the dielectric layer, wherein, after the recessing, the recessed dielectric layer lines a lower portion of the sidewalls of the first insulating layer and the exposed portion of the substrate.

According to various embodiments presented herein, a method of removing a high-k dielectric material is provided. The method may include: providing a workpiece comprising the high-k dielectric material; providing a radio-frequency biasing power; and removing the high-k dielectric material by means of an etch process comprising an etch chemistry of chlorine, boron trichloride, and oxygen.

According to various embodiments presented herein, a semiconductor device is provided. The semiconductor device may include: a workpiece having a recess; a dielectric layer lining a bottom surface and a lower portion of a sidewall of the recess; and a conductive structure disposed within the recess, wherein a top surface of the conductive structure and a top surface of the dielectric layer are disposed within the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a workpiece having a recess and a dielectric layer having a first portion lining the recess and a second portion lining a top surface of the workpiece;
   forming a conductive structure within the recess, wherein: the conductive structure partially fills the recess; the conductive structure comprises topmost lateral extents disposed within the recess; and formation of the conductive structure leaves the second portion of the dielectric layer exposed; and
   after forming the conductive structure, removing the second portion of the dielectric layer and exposed regions of the first portion of the dielectric layer, wherein, after the removing, a top surface of the recessed dielectric layer is disposed within the recess, and
   the recessed dielectric layer is substantially coplanar with a to surface of the conductive structure formed within the recess.

2. The method of claim 1, further comprising:
   filling the recess with an insulating layer, wherein the insulating layer covers the top surface of the recessed dielectric layer and a top surface of the conductive structure formed within the recess.

3. The method of claim 1, wherein the conductive structure comprises a gate electrode.

4. The method of claim 1, wherein the dielectric layer comprises a dielectric material having a dielectric constant greater than or substantially equal to about 5.

5. The method of claim 1, wherein the workpiece comprises an insulating material.

6. The method of claim 1, wherein removing the dielectric layer comprises an etch process comprising an etch chemistry of chlorine, boron trichloride, and oxygen.

7. The method of claim 1, wherein the semiconductor device comprises a FinFET.

8. A method of manufacturing a semiconductor device, the method comprising:
  providing a substrate having a source region and a drain region formed therein;
  forming a first insulating layer over a top surface of the substrate;
  removing the first insulating layer disposed between the source region and the drain region to expose a portion of the substrate;
  forming a dielectric layer lining a topmost surface and sidewalls of the first insulating layer and lining the exposed portion of the substrate;
  forming a gate electrode between the sidewalls of the first insulating layer and over the dielectric layer lining the exposed portion of the substrate, wherein a topmost surface of the gate electrode is disposed at a level lower than the dielectric layer lining the topmost surface of the first insulating layer; and
  after forming the gate electrode, recessing the dielectric layer, wherein, after the recessing, the recessed dielectric layer lines a lower portion of the sidewalls of the first insulating layer and the exposed portion of the substrate, and
  the recessed dielectric layer is substantially coplanar with the top surface of the gate electrode.

9. The method of claim 8, further comprising:
  forming a second insulating layer over the gate electrode and over the recessed dielectric layer, wherein the second insulating layer covers a top surface of the recessed dielectric layer and the top surface of the gate electrode.

10. The method of claim 8, wherein the gate electrode comprises a conductive liner and a conductive layer, and wherein forming the gate electrode between the sidewalls of the first insulating layer and over the dielectric layer lining the exposed portion of the substrate comprises:
  forming the conductive liner over the dielectric layer;
  forming the conductive layer over the conductive liner;
  planarizing the conductive layer and the conductive liner, whereby a top surface of the conductive layer and a top surface of the conductive liner are substantially coplanar with a top surface of the dielectric layer lining the top surface of the first insulating layer; and
  recessing the top surface of the conductive layer and the top surface of the conductive liner after planarization to a level lower than the top surface of the first insulating layer.

11. The method of claim 10, wherein recessing the top surface of the conductive layer and the top surface of the conductive liner after planarization comprises:
  recessing the top surface of the conductive layer after recessing the top surface of the conductive liner, or vice versa.

12. The method of claim 8, wherein the substrate comprises a first fin and a second fin adjacent to the first fin, and wherein the source region is formed in the first fin and the drain region is formed in the second fin.

13. The method of claim 8, wherein the dielectric layer comprises a dielectric material having a dielectric constant greater than or substantially equal to about 5.

14. A method of manufacturing a semiconductor device, the method comprising:
  providing a workpiece having a recess, the recess comprising first lateral extents;
  lining the recess with a first portion of a first insulating layer;
  lining a top surface of the workpiece with a second portion of the first insulating layer;
  forming a conductive structure within the recess, the conductive structure comprising second lateral extents of a topmost portion of the conductive structure, wherein the second lateral extents are disposed within the first lateral extents; and
  after forming the conductive structure, removing the second portion of the first insulating layer and exposed regions of the first portion of the first insulating layer, wherein, after the removing, a top surface of the first insulating layer is disposed within the recess, and the top surface of the first insulating layer is substantially coplanar with the top surface of the conductive structure.

15. The method of claim 14, further comprising, after the removing, filling the recess with a second insulating layer, wherein the second insulating layer covers the top surface of the first insulating layer and a top surface of the conductive structure formed within the recess.

16. The method of claim 14, wherein the conductive structure comprises a gate electrode.

17. The method of claim 16, wherein the gate electrode comprises a conductive liner and a conductive layer.

18. The method of claim 14, wherein removing the first insulating layer comprises etching with an etch chemistry comprising chlorine, boron trichloride, and oxygen.

19. The method of claim 14, wherein the semiconductor device comprises a FinFET.

20. The method of claim 14, wherein the first insulating layer comprises a dielectric material having a dielectric constant greater than or substantially equal to about 5.

* * * * *